(12) United States Patent
Zainuddin et al.

(10) Patent No.: US 11,875,043 B1
(45) Date of Patent: Jan. 16, 2024

(54) LOOP DEPENDENT WORD LINE RAMP START TIME FOR PROGRAM VERIFY OF MULTI-LEVEL NAND MEMORY

(71) Applicant: SanDisk Technologies LLC, Addison, TX (US)

(72) Inventors: Abu Naser Zainuddin, Milpitas, CA (US); Jiahui Yuan, Fremont, CA (US); Toru Miwa, Yokohama (JP)

(73) Assignee: SanDisk Technologies LLC, Addison, TX (US)

( * ) Notice: Subject to any disclaimer, the term of this patent is extended or adjusted under 35 U.S.C. 154(b) by 9 days.

(21) Appl. No.: 17/943,560

(22) Filed: Sep. 13, 2022

Related U.S. Application Data

(63) Continuation-in-part of application No. 17/897,993, filed on Aug. 29, 2022.

(51) Int. Cl.
*G06F 3/06* (2006.01)

(52) U.S. Cl.
CPC .......... *G06F 3/0625* (2013.01); *G06F 3/0653* (2013.01); *G06F 3/0679* (2013.01)

(58) Field of Classification Search
CPC ..... G06F 3/0625; G06F 3/0653; G06F 3/0679
USPC ........................................................ 711/154
See application file for complete search history.

(56) References Cited

U.S. PATENT DOCUMENTS

| | | | |
|---|---|---|---|
| 6,560,152 B1 | 5/2003 | Cernea | |
| 6,801,454 B2 | 10/2004 | Wang et al. | |
| 8,051,240 B2 | 11/2011 | Dutta et al. | |
| 8,320,177 B2 | 11/2012 | Dutta et al. | |
| 8,456,911 B2 | 6/2013 | Yuan et al. | |
| 8,644,075 B2 | 2/2014 | Hemink et al. | |
| 9,123,424 B2 | 9/2015 | Oowada et al. | |
| 9,286,987 B1 | 3/2016 | Dong et al. | |
| 9,466,369 B1 | 10/2016 | Pang et al. | |
| 9,583,198 B1 | 2/2017 | Pang et al. | |
| 10,388,390 B2 | 8/2019 | Costa | |
| 10,446,244 B1 | 10/2019 | Diep et al. | |
| 10,471,262 B2 | 11/2019 | Perryman et al. | |
| 10,510,413 B1 | 12/2019 | Diep et al. | |
| 10,522,232 B2 | 12/2019 | Chen et al. | |
| 10,971,231 B1 | 4/2021 | Gautam et al. | |
| 11,270,776 B1 | 3/2022 | Lien et al. | |
| 11,328,780 B1* | 5/2022 | Xu | G11C 16/24 |
| 2008/0291737 A1* | 11/2008 | Moon | G11C 16/3404 365/185.29 |
| 2009/0052255 A1* | 2/2009 | Moon | H10B 41/30 365/194 |
| 2010/0061151 A1 | 3/2010 | Miwa et al. | |

(Continued)

OTHER PUBLICATIONS

U.S. Appl. No. 17/897,993, filed Aug. 29, 2022.
U.S. Appl. No. 17/898,006, filed Aug. 29, 2022.

*Primary Examiner* — Than Nguyen
(74) *Attorney, Agent, or Firm* — Vierra Magen Marcus LLP

(57) ABSTRACT

To reduce spikes in the current used by a NAND memory die during a write operation using smart verify, different amounts of delay are introduced into the loops of the programing algorithm. Depending on the number of verify levels following a programming pulse, differing amounts of wait time are used before biasing a selected word line to the verify levels or levels. For example, if only a single verify level is used, a shorter delay is used than if two verify levels are used.

20 Claims, 30 Drawing Sheets

(56) References Cited

U.S. PATENT DOCUMENTS

| | | | |
|---|---|---|---|
| 2012/0140568 A1 | 6/2012 | Dutta et al. | |
| 2012/0294093 A1* | 11/2012 | Yang | G11C 16/26 |
| | | | 365/185.22 |
| 2013/0094292 A1 | 4/2013 | Park et al. | |
| 2016/0217869 A1* | 7/2016 | Tseng | G11C 16/3459 |
| 2016/0307630 A1* | 10/2016 | Choo | G11C 16/32 |
| 2017/0097869 A1 | 4/2017 | Sharon et al. | |
| 2017/0309344 A1* | 10/2017 | Dutta | G11C 16/0483 |
| 2019/0043563 A1* | 2/2019 | Khakifirooz | G11C 11/5628 |
| 2019/0043594 A1* | 2/2019 | Zhao | G11C 11/5628 |
| 2020/0118630 A1 | 4/2020 | Lin et al. | |
| 2020/0227124 A1 | 7/2020 | Yang et al. | |
| 2020/0388342 A1* | 12/2020 | Yang | G11C 16/26 |
| 2023/0050399 A1* | 2/2023 | Jeong | G11C 16/30 |
| 2023/0104044 A1* | 4/2023 | Choi | G11C 7/1039 |
| | | | 365/185.22 |
| 2023/0139427 A1* | 5/2023 | Seo | G06N 3/08 |
| | | | 365/185.03 |

* cited by examiner

Figure 7A
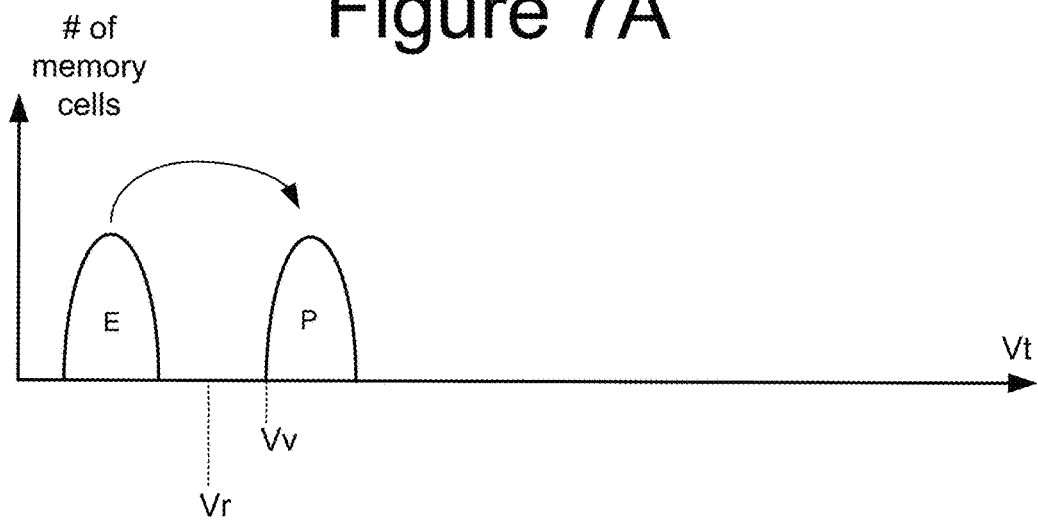
Figure 7B
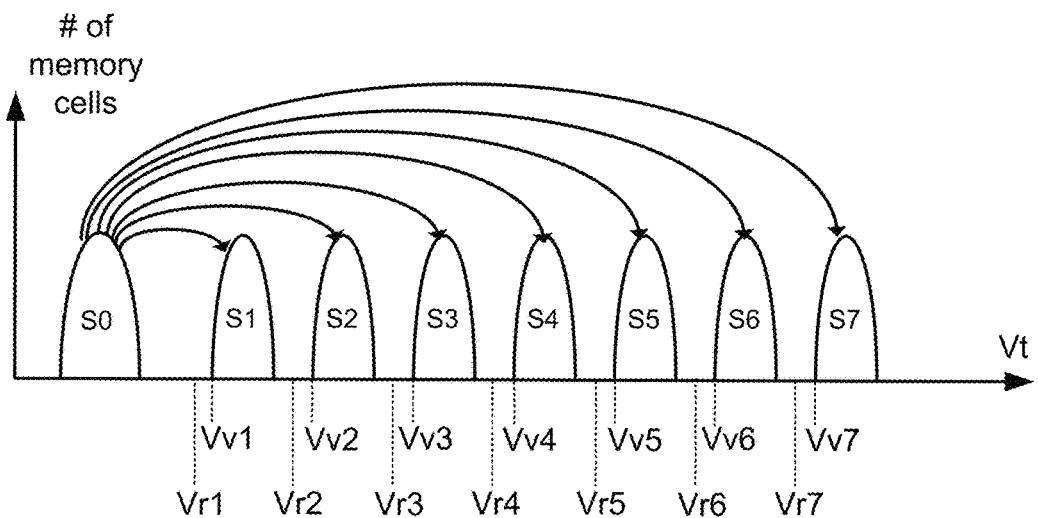
Figure 7C
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

Figure 23
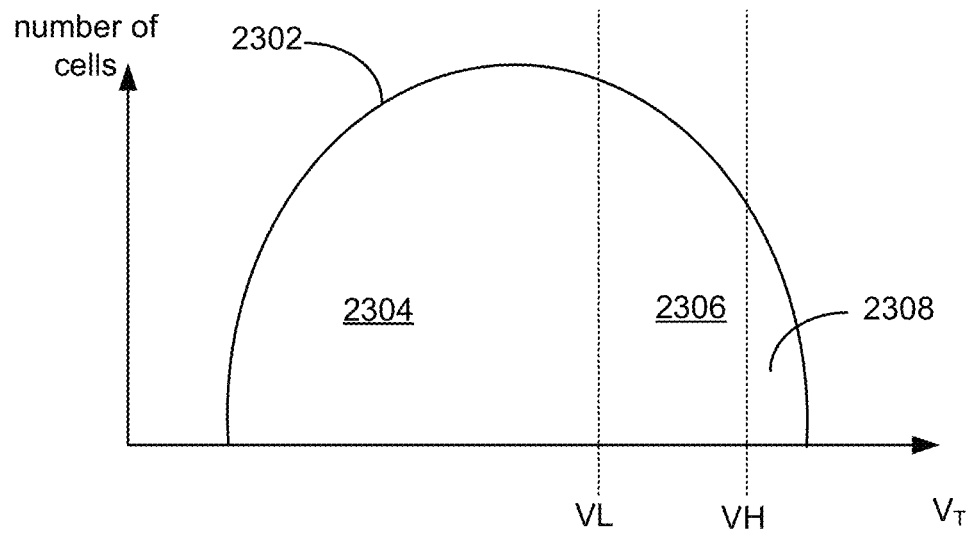
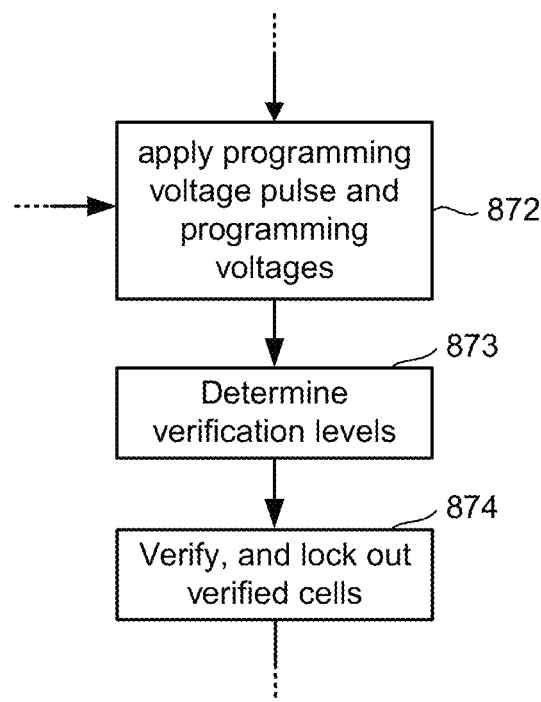
Figure 24

# LOOP DEPENDENT WORD LINE RAMP START TIME FOR PROGRAM VERIFY OF MULTI-LEVEL NAND MEMORY

CROSS-REFERENCE TO RELATED APPLICATION

This application is a Continuation-in-Part of U.S. patent application Ser. No. 17/897,993 filed Aug. 29, 2022, which is incorporated herein by reference in its entirety.

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed, but also want the memory to consume less power.

BRIEF DESCRIPTION OF THE DRAWINGS

Like-numbered elements refer to common components in the different figures.

FIG. 7A depicts threshold voltage distributions of memory cells in a binary embodiment.

FIG. 7B depicts threshold voltage distributions of memory cells in a multi-level cell (MLC) embodiment.

FIG. 7C is a table describing one example of an assignment of data values to data states.

FIG. 23 illustrates the idea of multiple verify levels for a single state, such as for use in a quick pass write embodiment.

FIG. 24 illustrates a modification of FIG. 8 for an embodiment to incorporate smart verify into the programming algorithm.

DETAILED DESCRIPTION

In a NAND memory architecture, in order to access selected memory cells for a program or read operation, a programming or sensing voltage is applied to the corresponding selected word line. To be able to accurately write or read the data of the selected memory cells, the other, unselected memory cells of the NAND strings need to be turned on sufficiently to not interfere with the write or read operation by applying a programming pass voltage (Vpass) or read pass voltage (Vread) to the corresponding unselected word lines. As the number of word lines in NAND memory devices can be very large, the simultaneous biasing of all of the unselected word lines to Vread or, in particular, Vpass can result in very large spikes in the current Icc drawn by a memory die.

To reduce these Icc spikes, the following uses different pass voltage ramp rates for different regions, or zones, of word lines. The properties of the word lines, such as their resistance and capacitance (RC) values, vary across the NAND memory array. By determining the RC values of the word lines across the array, the word lines can be broken into multiple zones based on these properties. The zones can then be individually assigned different ramp rates for applying a pass voltage to the unselected word lines, where a parameter for the ramp rates can be stored as a register value on the memory die. In other techniques to reduce such Icc spikes while maintaining performance, differential Vpass ramp rates can be used for multi-level (MLC) and binary (SLC) operation. Differential Vpass ramp rate interval values can also be used for MLC and SLC operation.

In other embodiments, in order to reduce spikes in the current used by a NAND memory die during a write operation using smart verify, different amounts of delay are introduced into the loops of the programming algorithm. Depending on the number of verify levels following a programming pulse, differing amounts of wait time are used before biasing a selected word line to the verify levels or levels. For example, if only a single verify level is used, a shorter delay is used than if two verify levels are used.

FIGS. 1A-6F describe one example of a storage system that can be used to implement the technology disclosed herein.

Figure 1A:
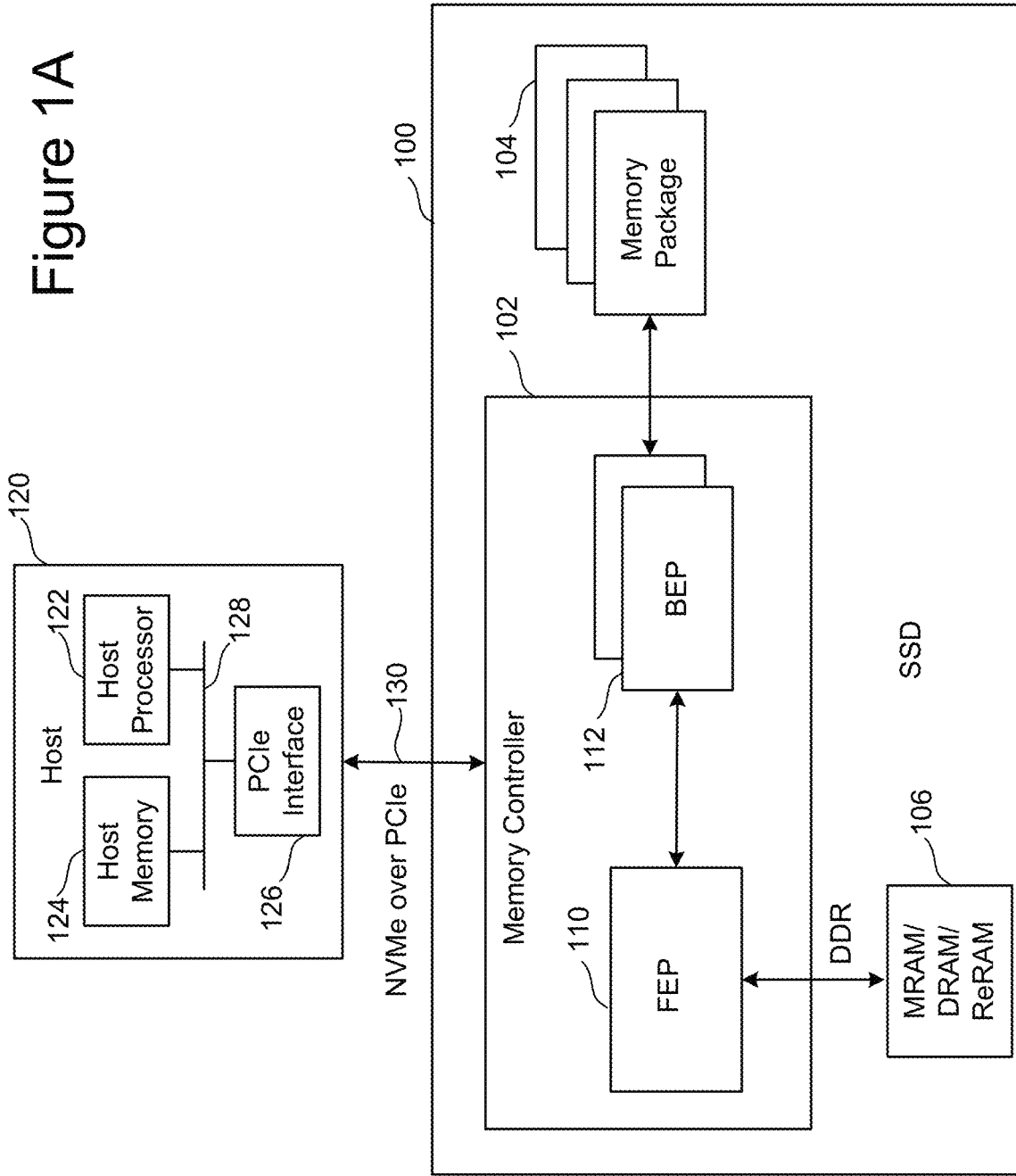
FIG. 1A is a block diagram of one embodiment of a storage system connected to a host.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
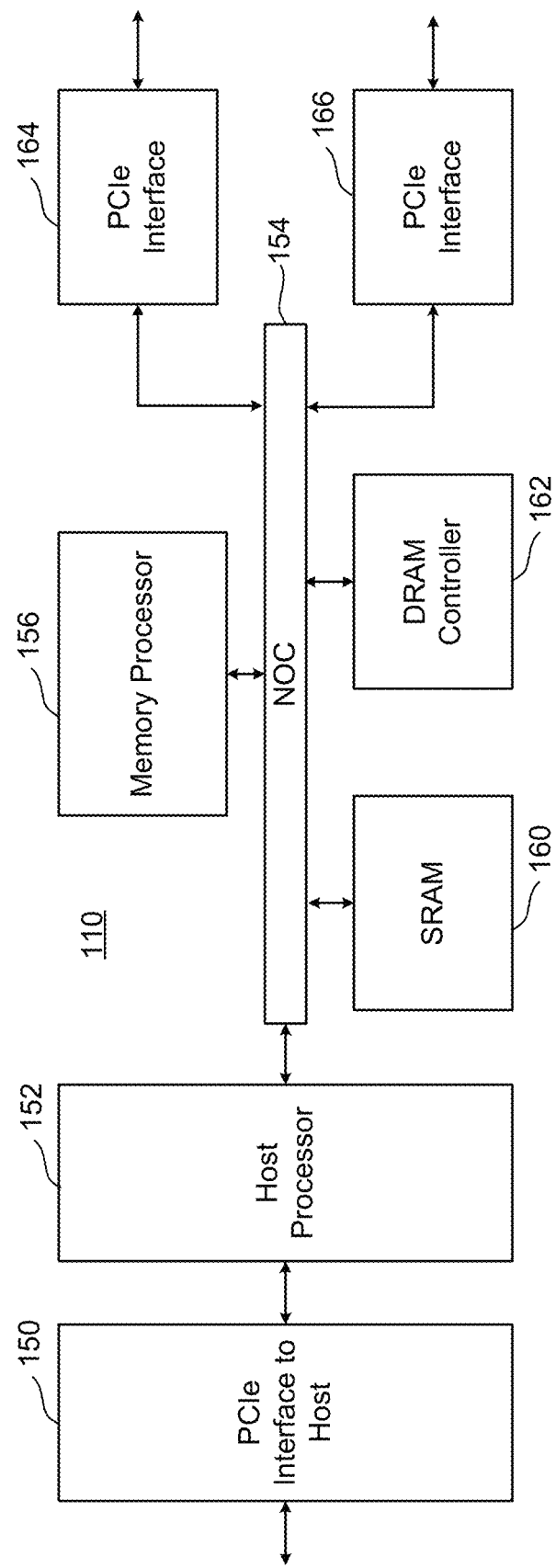
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
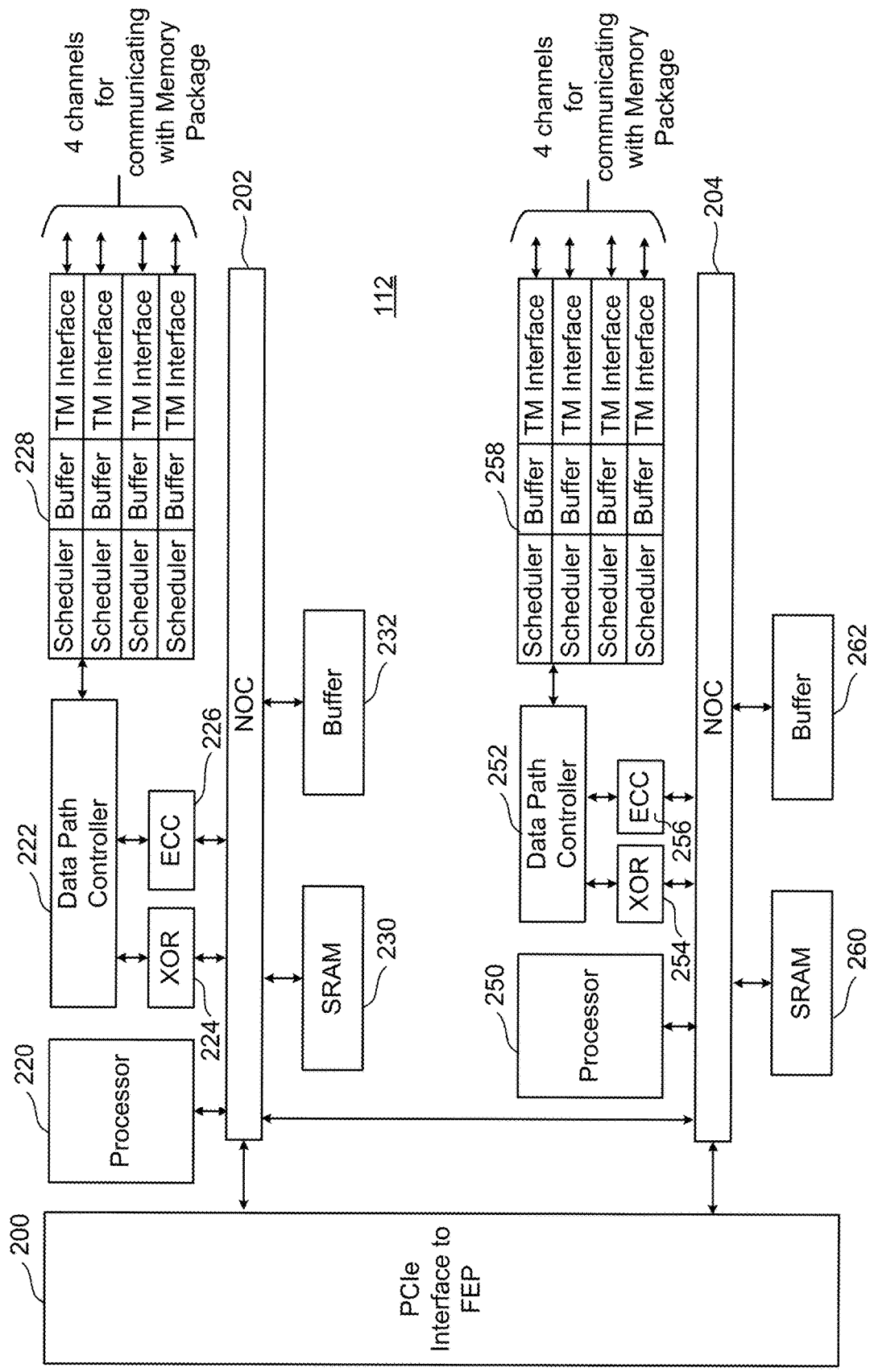
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
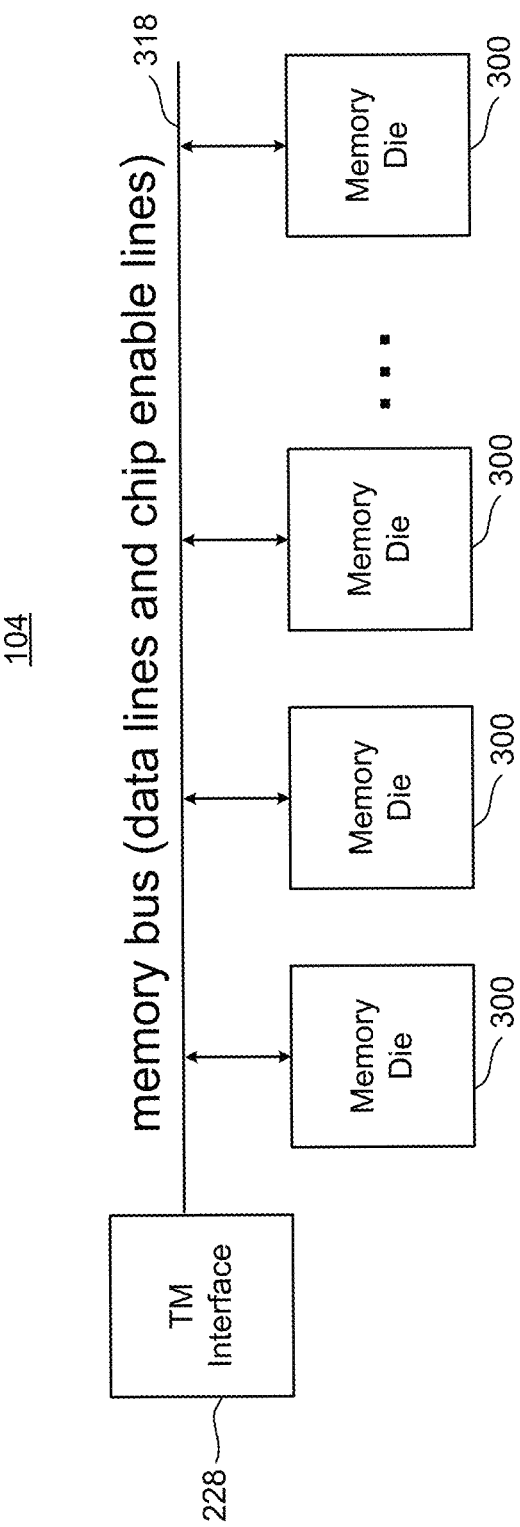
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
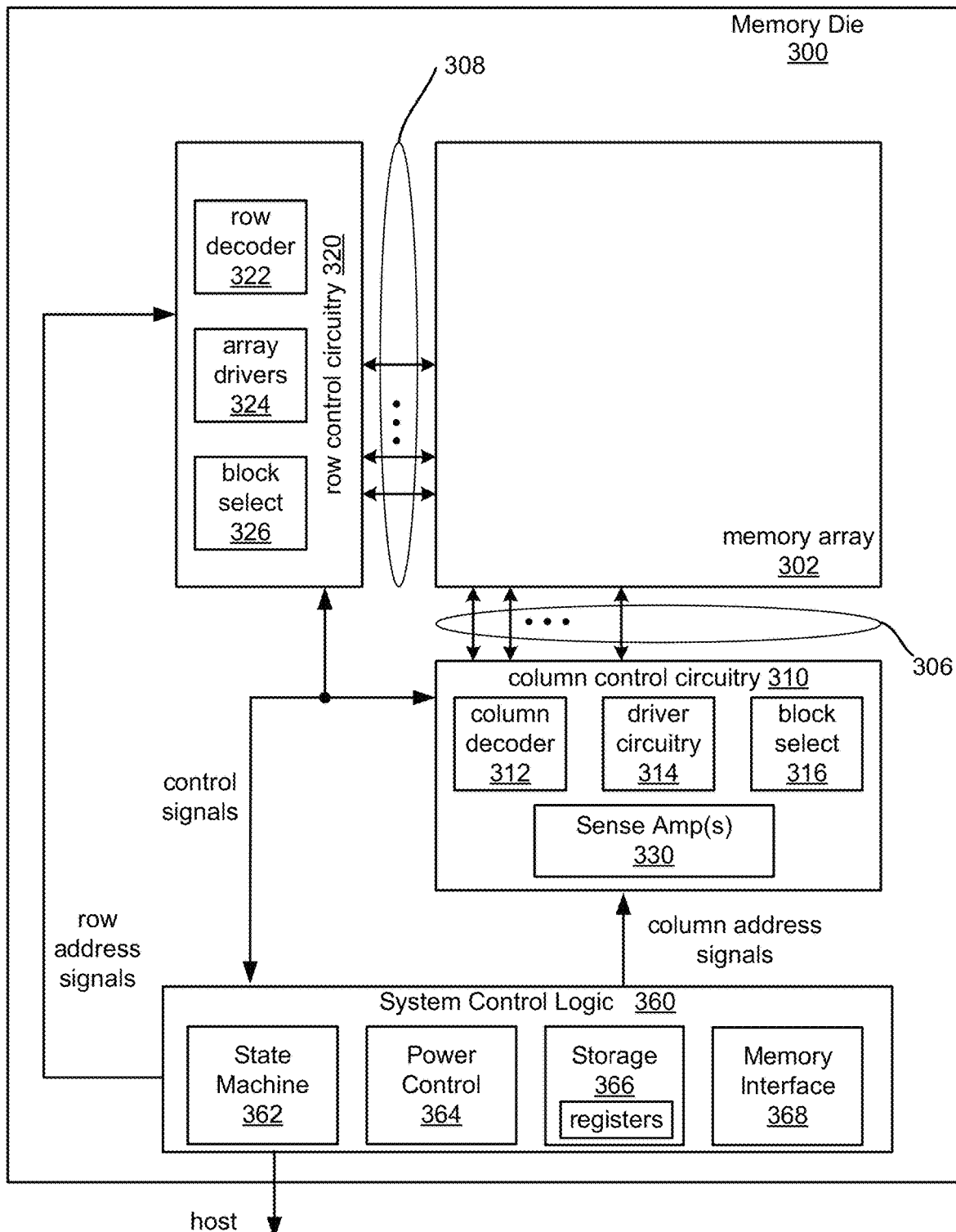
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "one or more control circuits" can include a controller, a state machine, a micro-controller, micro-processor, and/or other control circuitry as represented by the system control logic 360, or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of memory system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the memory system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
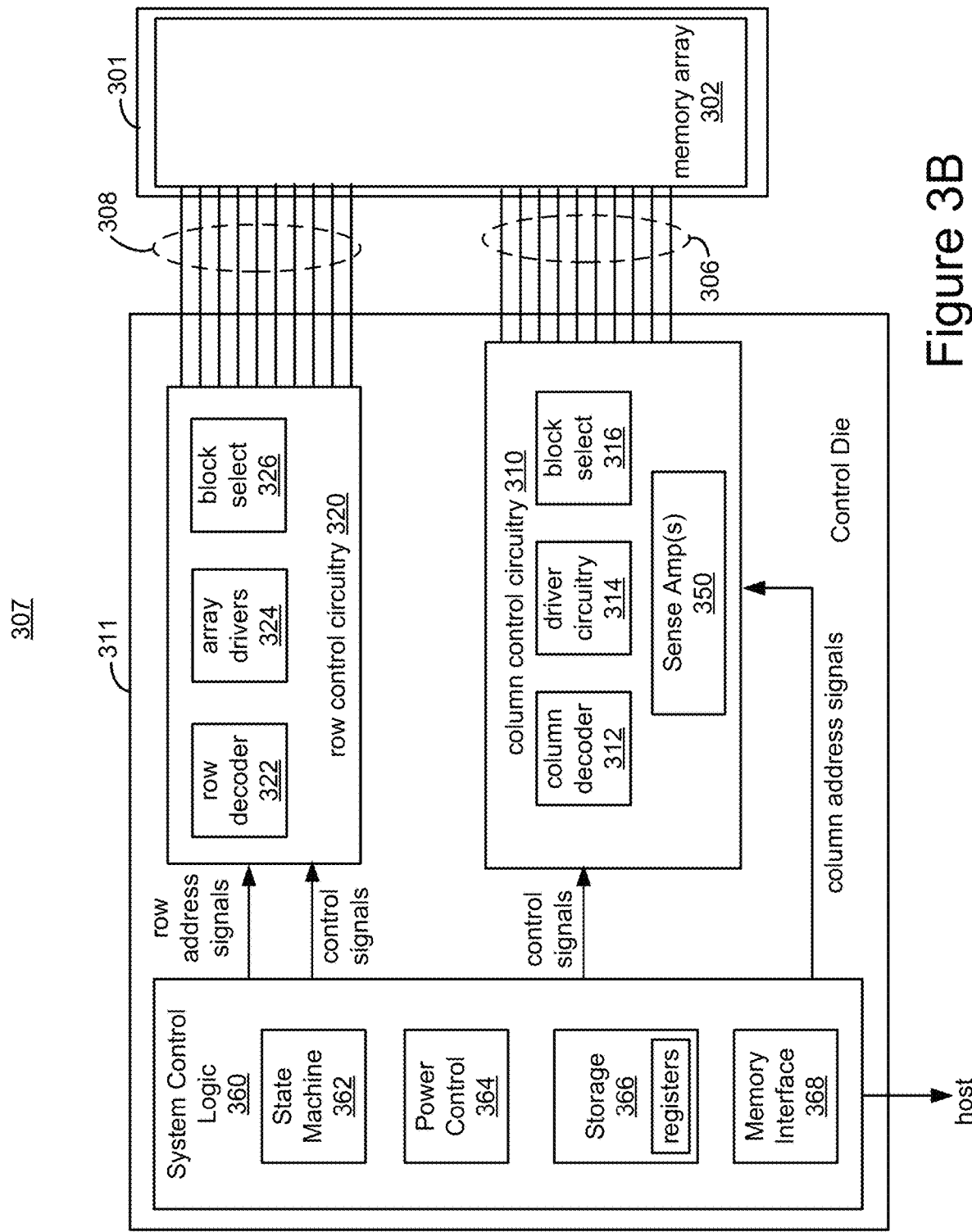
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "one or more control circuits" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 4:
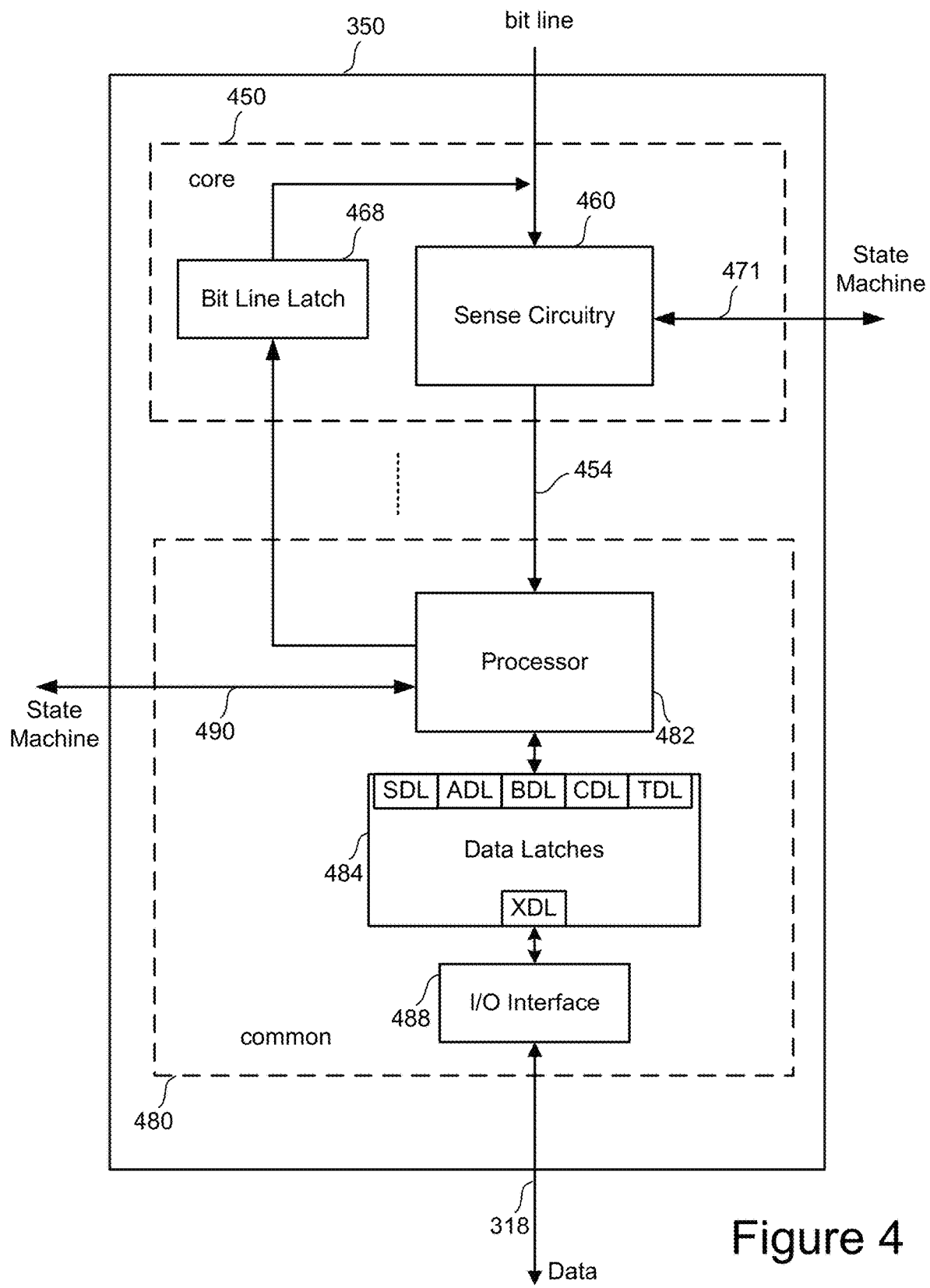
FIG. 4 is a block diagram of an individual sense block partitioned into a core portion and a common portion.

FIG. 4 is a block diagram of an individual sense block of sense amplifiers 350 partitioned into a core portion, referred to as a sense module 480, and a common portion 480. In one embodiment, there will be a separate sense module 450 for each bit line and one common portion 480 for a set of multiple sense modules 450. In one example, a sense block will include one common portion 480 and eight sense, twelve, or sixteen modules 450. Each of the sense modules in a group will communicate with the associated common portion via a data bus 454.

Sense module 450 comprises sense circuitry 460 that determines whether a conduction current in a connected bit line is above or below a predetermined level or, in voltage based sensing, whether a voltage level in a connected bit line is above or below a predetermined level. The sense circuitry 460 is to received control signals from the state machine via input lines 471. In some embodiments, sense module 450 includes a circuit commonly referred to as a sense amplifier. Sense module 450 also includes a bit line latch 468 that is used to set a voltage condition on the connected bit line. For example, a predetermined state latched in bit line latch 468 will result in the connected bit line being pulled to a state designating program inhibit (e.g., Vdd).

Common portion 480 comprises a processor 468, a set of data latches 484 and an I/O Interface 488 coupled between the set of data latches 484 and data bus 318. Processor 468 performs computations. For example, one of its functions is to determine the data stored in the sensed memory cell and store the determined data in the set of data latches. The set of data latches 484 is used to store data bits determined by processor 468 during a read operation. It is also used to store data bits imported from the data bus 318 during a program operation. The imported data bits represent write data meant to be programmed into the memory. I/O interface 488 provides an interface between data latches 484 and the data bus 318.

During read or sensing, the operation of the system is under the control of state machine 362 that controls (using power control 364) the supply of different control gate or other bias voltages to the addressed memory cell(s). As it steps through the various predefined control gate voltages corresponding to the various memory states supported by the memory, the sense module 450 may trip at one of these voltages and an output will be provided from sense module 450 to processor 482 via bus 454. At that point, processor 482 determines the resultant memory state by consideration of the tripping event(s) of the sense module and the information about the applied control gate voltage from the state machine via input lines 490. It then computes a binary encoding for the memory state and stores the resultant data bits into data latches 484. In another embodiment of the core portion, bit line latch 468 serves double duty, both as a latch for latching the output of the sense module 450 and also as a bit line latch as described above.

Data latch stack 484 contains a stack of data latches corresponding to the sense module. In one embodiment, there are three, four or another number of data latches per sense module 450. In one embodiment, the latches are each one bit. In this document, the latches in one embodiment of data latch stack 484 will be referred to as SDL, XDL, ADL, BDL, and CDL. In the embodiments discussed here, the latch XDL is a transfer latch used to exchange data with the I/O interface 488. In addition to a first sense amp data latch SDL, the additional latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In 2-bit per cell embodiment, only ADL and BDL might be used, while a 4-bit per cell MLC embodiment might include a further set of DDL latches. In other embodiments, the XDL latches can be used to hold additional pages of data, such as a 4-bit per cell MLC embodiment the uses the XDL latches in addition to the three sets of latches ADL, BDL, CDL for four pages of data. The following discussion will mainly focus on a 3-bit per cell embodiment, as this can illustrate the main features but not get overly complicated, but the discussion can also be applied to embodiments with more or fewer bit per cell formats. Some embodiments many also include additional latches for particular functions, such as represented by the TDL latch where, for example, this could be used in "quick pass write" operations where it is used in program operations for when a memory cell is approaching its target state and is partially inhibited to slow its programming rate.

For example, in some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 484 from the data bus 318. During the verify process, processor 482 monitors the verified memory state relative to the desired memory state. When the two are in agreement, processor 482 sets the bit line latch 468 so as to cause the bit line to be pulled to a state designating program inhibit. This inhibits the memory cell coupled to the bit line from further programming even if it is subjected to programming pulses on its control gate. In other embodiments the processor initially loads the bit line latch 468 and the sense circuitry sets it to an inhibit value during the verify process.

In some implementations (but not required), the data latches are implemented as a shift register so that the parallel data stored therein is converted to serial data for data bus 318, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 5A:
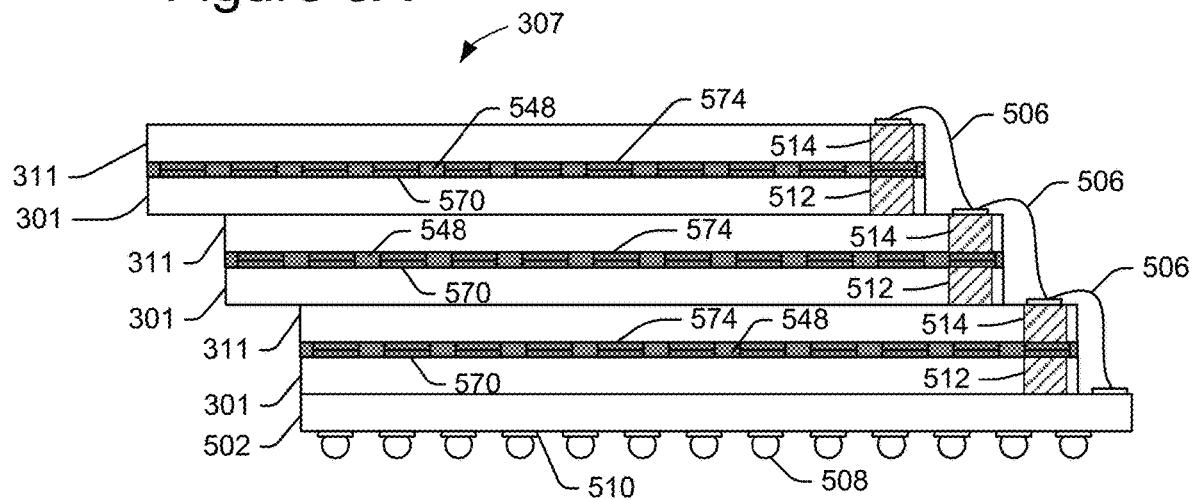
FIG. 5A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control die 311 and multiple memory structure die 301. FIG. 5A depicts a side view of an embodiment of an integrated memory assembly 307 stacked on a substrate 502 (e.g., a stack comprising control dies 311 and memory structure dies 301). The integrated memory assembly 307 has three control dies 311 and three memory structure dies 301. In some embodiments, there are more than three memory structure dies 301 and more than three control die 311.

Each control die 311 is affixed (e.g., bonded) to at least one of the memory structure dies 301. Some of the bond pads 570, 574, are depicted. There may be many more bond pads. A space between two dies 301, 311 that are bonded together is filled with a solid layer 548, which may be formed from epoxy or other resin or polymer. This solid layer 548 protects the electrical connections between the dies 301, 311, and further secures the dies together. Various materials may be used as solid layer 548, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 506 connected to the bond pads connect the control die 311 to the substrate 502. A number of such wire bonds may be formed across the width of each control die 311 (i.e., into the page of FIG. 5A).

A memory structure die through silicon via (TSV) 512 may be used to route signals through a memory structure die 301. A control die through silicon via (TSV) 514 may be used to route signals through a control die 311. The TSVs 512, 514 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 508 may optionally be affixed to contact pads 510 on a lower surface of substrate 502. The solder balls 508 may be used to electrically and mechanically couple the integrated memory assembly 307 to a host device such as a printed circuit board. Solder balls 508 may be omitted where the integrated memory assembly 307 is to be used as an LGA package. The solder balls 508 may form a part of the interface between the integrated memory assembly 307 and the memory controller 102.

Figure 5B:
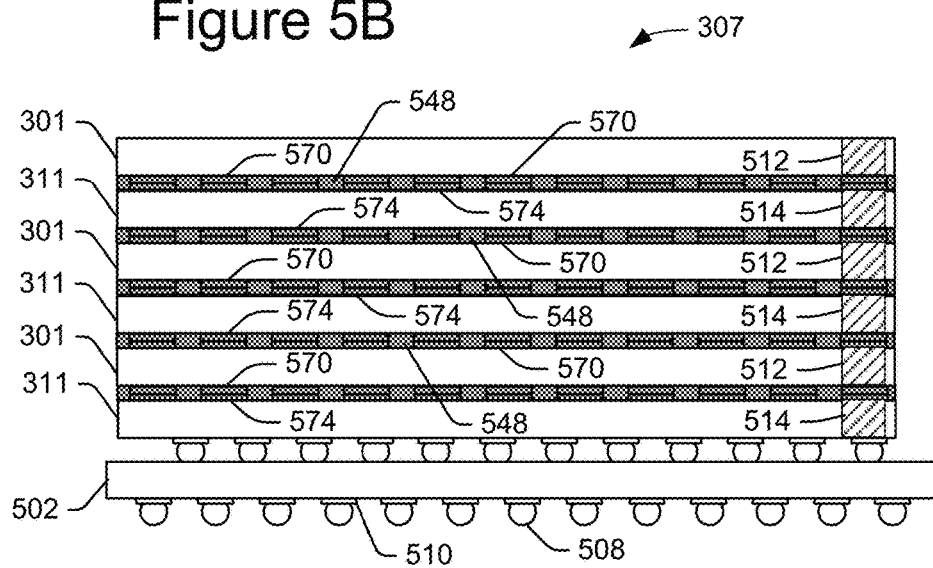
FIG. 5B depicts a side view of an embodiment of an integrated memory assembly stacked on a substrate.

FIG. 5B depicts a side view of an embodiment of an integrated memory assembly 307 stacked on a substrate 502. The integrated memory assembly 307 has three control die 311 and three memory structure die 301. In some embodiments, there are many more than three memory structure dies 301 and many more than three control dies 311. In this example, each control die 311 is bonded to at least one memory structure die 301. Optionally, a control die 311 may be bonded to two memory structure die 301.

Some of the bond pads 570, 574 are depicted. There may be many more bond pads. A space between two dies 301, 311 that are bonded together is filled with a solid layer 548, which may be formed from epoxy or other resin or polymer. In contrast to the example in FIG. 5A, the integrated memory assembly 307 in FIG. 5B does not have a stepped offset. A memory structure die through silicon via (TSV) 512 may be used to route signals through a memory structure die 301. A control die through silicon via (TSV) 514 may be used to route signals through a control die 311.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material, but in embodiments, it may be Hysol epoxy resin from Henkel Corp., having offices in California, USA.

Figure 6A:
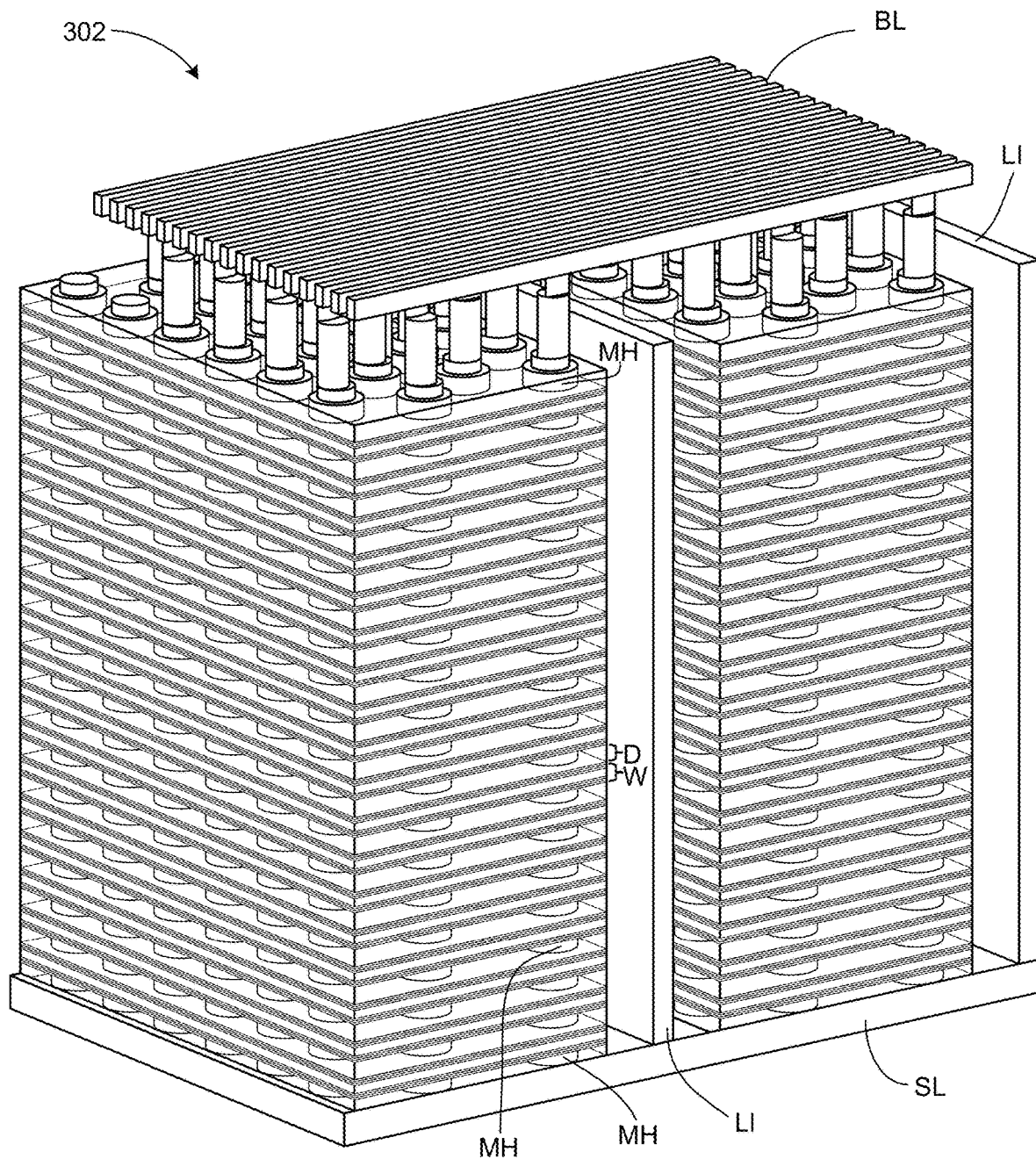
FIG. 6A is a perspective view of a portion of one example embodiment of a monolithic three dimensional memory array that can comprise memory structure.

FIG. 6A is a perspective view of a portion of one example embodiment of a monolithic three dimensional memory array that can comprise memory structure 302, which includes a plurality non-volatile memory cells. For example, FIG. 6A shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 6A shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 6A, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 6B:
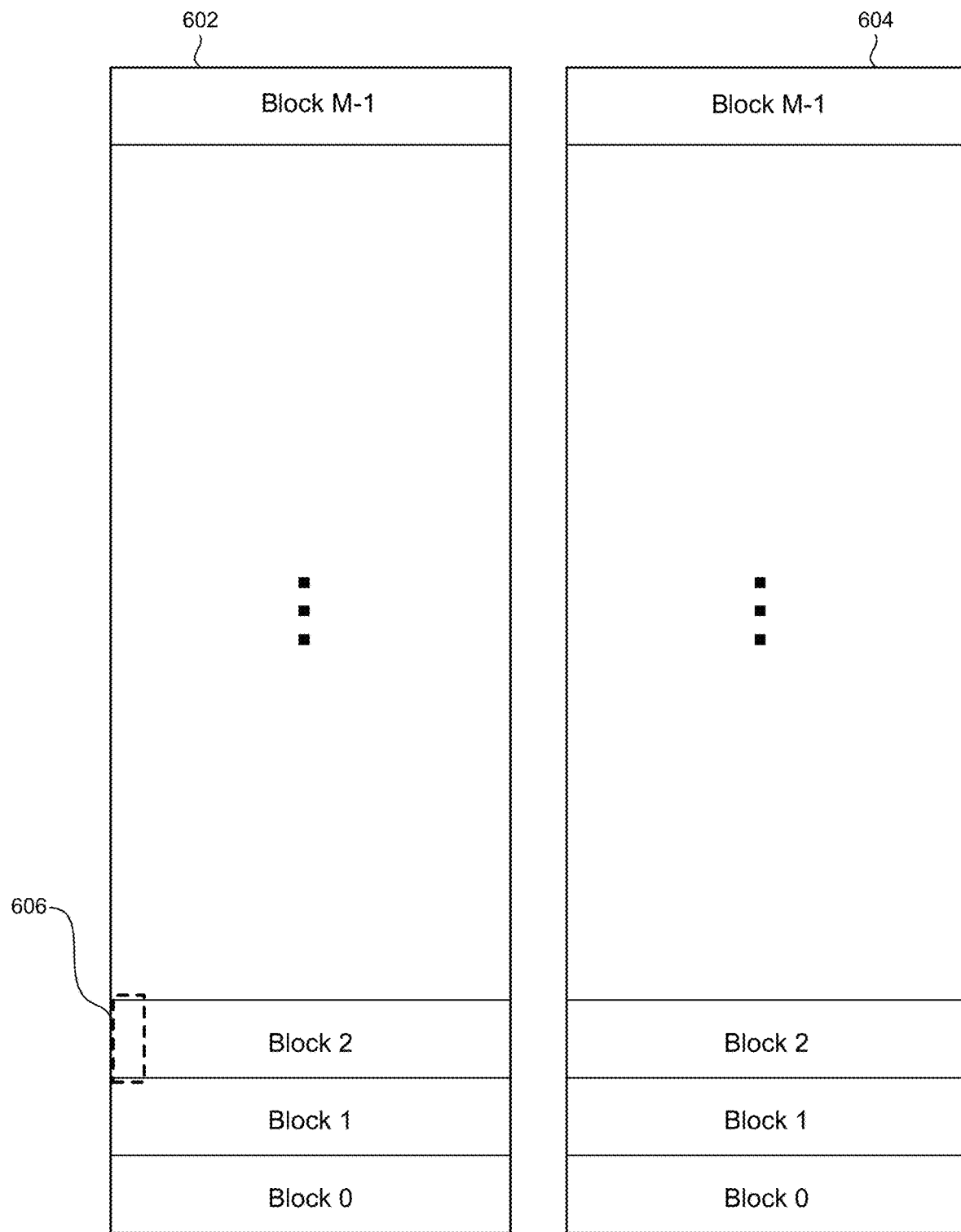
FIG. 6B is a block diagram explaining one example organization of memory structure.

FIG. 6B is a block diagram explaining one example organization of memory structure 302, which is divided into two planes 602 and 604. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 602 includes block 0, 2, 4, 6, . . . and plane 604 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 302 to enable the signaling and selection circuits.

Figure 6C:
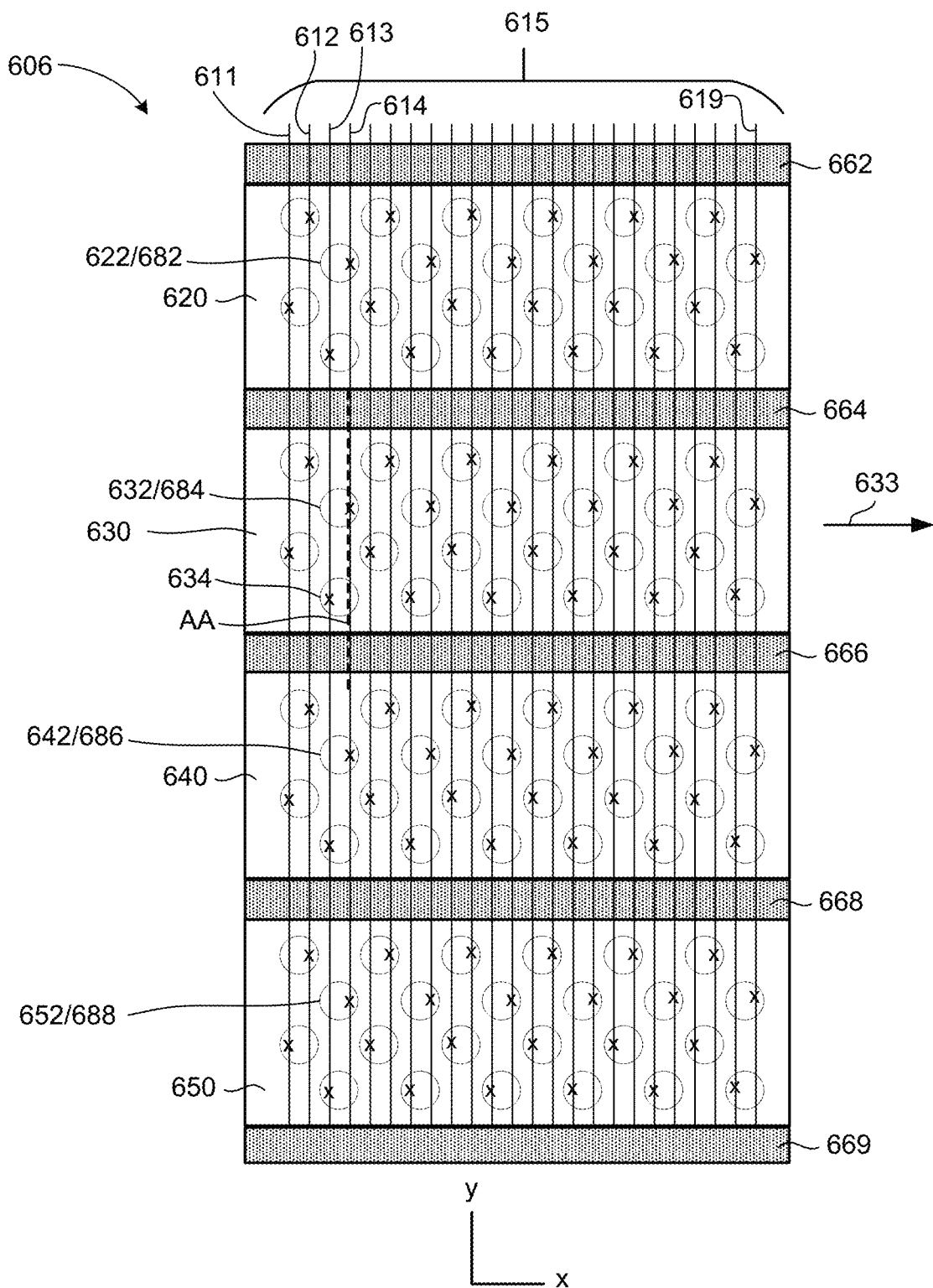
FIG. 6C is a block diagram depicting a top view of a portion of one block from the memory structure.
Figure 6D:
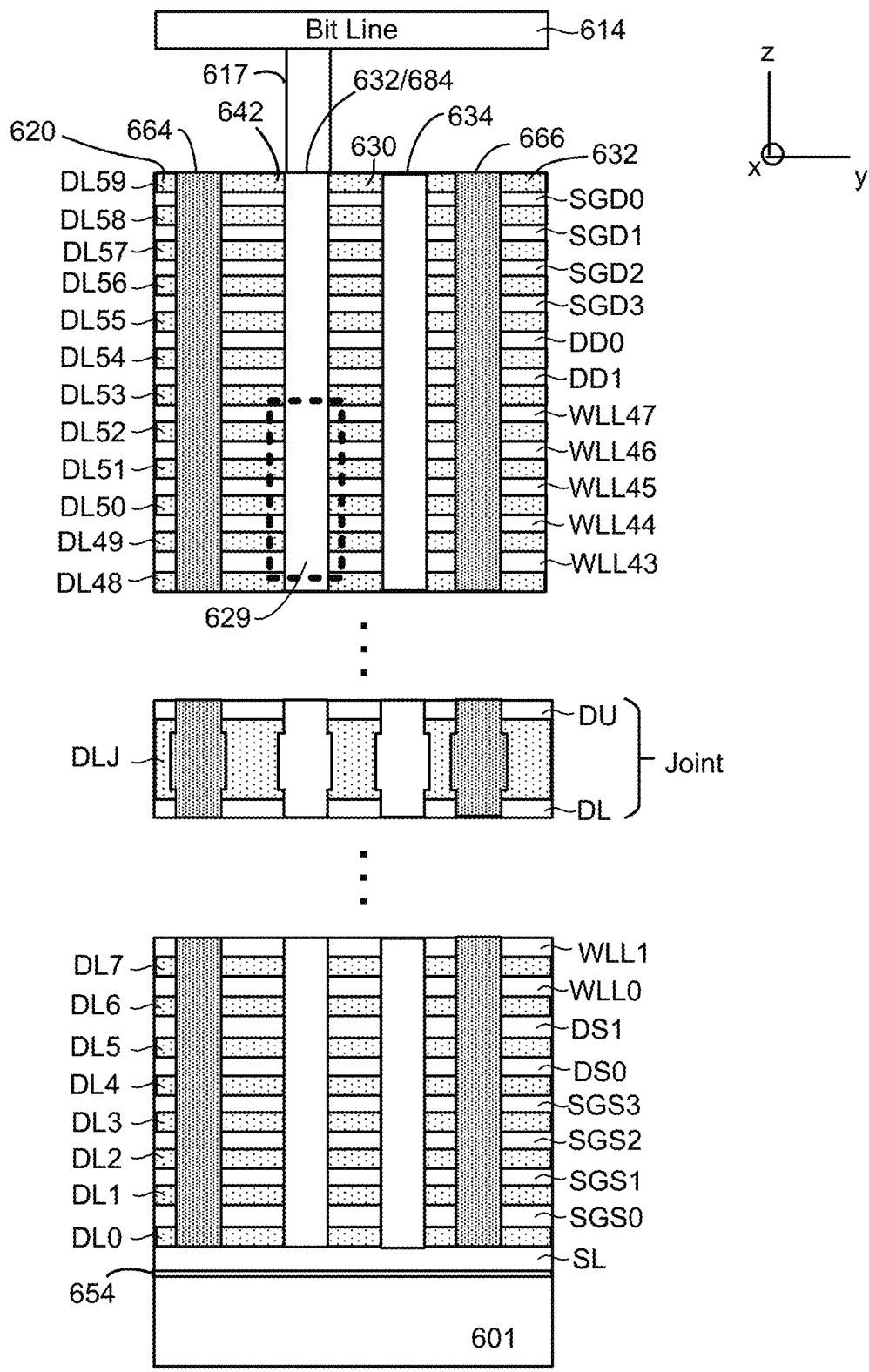
FIG. 6D depicts a portion of an embodiment of three dimensional memory structure showing a cross-sectional view along line AA of FIG. 6C.
Figure 6E:
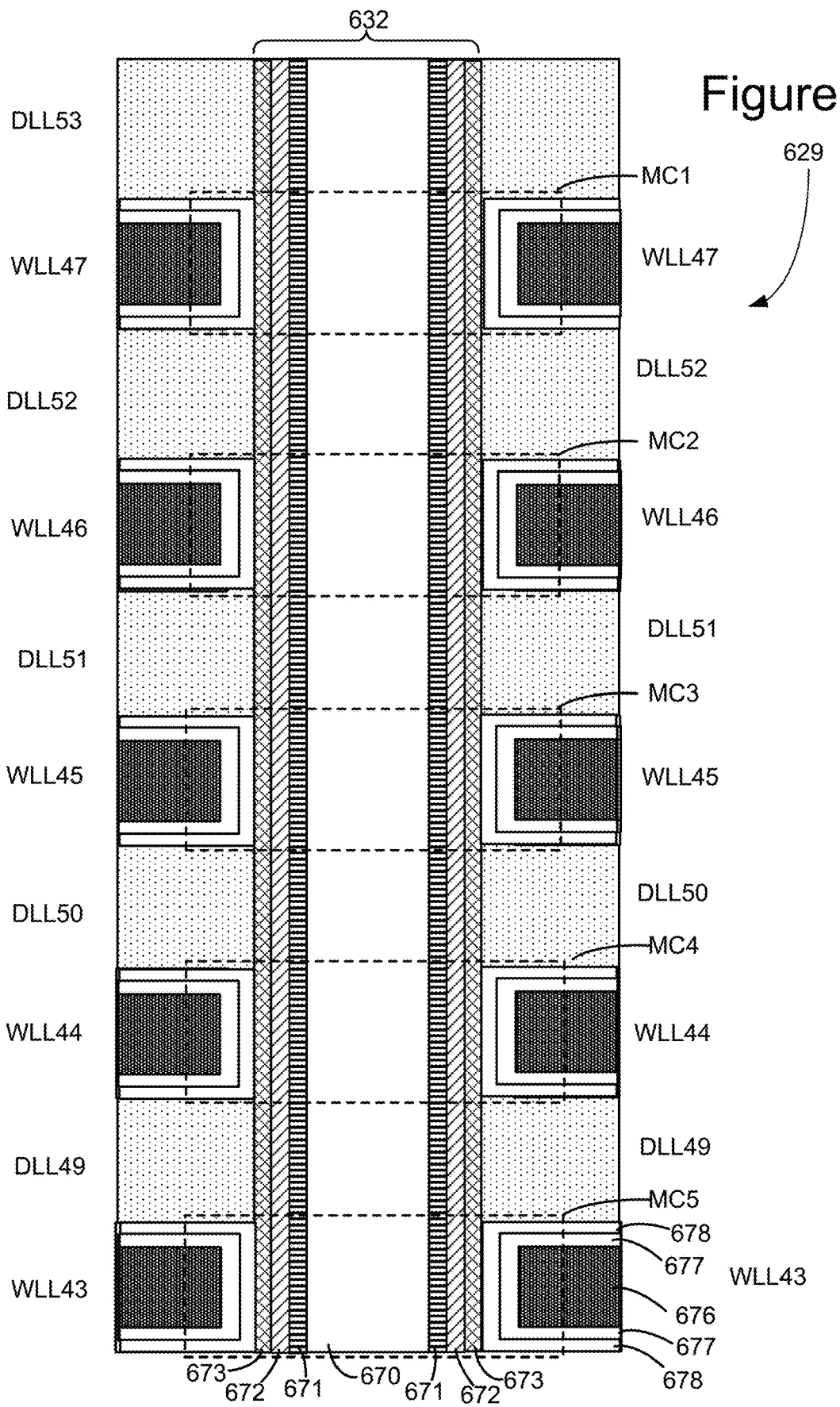
FIG. 6E depicts a cross sectional view of region of FIG. 6D that includes a portion of a vertical column.

FIGS. 6C-6E depict an example 3D NAND structure. FIG. 6C is a block diagram depicting a top view of a portion of one block from memory structure 302. The portion of the block depicted in FIG. 6C corresponds to portion 606 in block 2 of FIG. 6B. As can be seen from FIG. 6C, the block depicted in FIG. 6C extends in the direction of 633. In one embodiment, the memory array will have 60 layers. Other embodiments have less than or more than 60 layers. However, FIG. 6C only shows the top layer.

FIG. 6C depicts a plurality of circles that represent the vertical columns. Each of the vertical columns include multiple select transistors and multiple memory cells. In one embodiment, each vertical column implements a NAND string. For example, FIG. 6C depicts vertical columns 622, 632, 642 and 652. Vertical column 622 implements NAND string 682. Vertical column 632 implements NAND string 684. Vertical column 642 implements NAND string 686. Vertical column 652 implements NAND string 688. More details of the vertical columns are provided below. Since the block depicted in FIG. 6C extends in the direction of arrow 633 and in the direction of arrow 633, the block includes more vertical columns than depicted in FIG. 6C.

FIG. 6C also depicts a set of bit lines 615, including bit lines 611, 612, 613, 614, . . . , 619. FIG. 6C shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 614 is connected to vertical columns 622, 632, 642 and 652.

The block depicted in FIG. 6C includes a set of local interconnects 662, 664, 666, 668 and 669 that connect the various layers to a source line below the vertical columns. Local interconnects 662, 664, 666, 668 and 669 also serve to divide each layer of the block into four regions; for example, the top layer depicted in FIG. 6C is divided into regions 620, 630, 640 and 650, which are referred to as fingers or sub-blocks. In the layers of the block that implement memory cells, the four regions are referred to as word line sub-blocks that are separated by the local interconnects. In one embodiment, the word line sub-blocks on a common level of a block connect together at the end of the block to form a single word line. In another embodiment, the word line sub-blocks on the same level are not connected together. In one example implementation, a bit line only connects to one vertical column in each of regions 620, 630, 640 and 650. In that implementation, each block has sixteen rows of active columns and each bit line connects to four rows in each block. In one embodiment, all of four rows connected to a common bit line are connected to the same word line (via different word line sub-blocks on the same level that are connected together). Therefore, the system uses the source side select lines and the drain side select lines to choose one (or another subset) of the four to be subjected to a memory operation (program, verify, read, and/or erase).

Although FIG. 6C shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 6C also shows the vertical columns being staggered. In other embodiments, different patterns of staggering can be used. In some embodiments, the vertical columns are not staggered.

FIG. 6D depicts a portion of an embodiment of three dimensional memory structure 302 showing a cross-sectional view along line AA of FIG. 6C. This cross sectional view cuts through vertical columns 632 and 634 and region 630 (see FIG. 6C). The structure of FIG. 6D includes: four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or fewer than four drain side select layers, more or fewer than four source side select layers, more or fewer than four dummy word line layers, and more or fewer than forty eight word line layers (e.g., 96 word line layers). Vertical columns 632 and 634 are depicted protruding through the drain side select layers, source side select layers, dummy word line layers and word line layers. In one embodiment, each vertical column comprises a NAND string. For example, vertical column 632 comprises NAND string 684. Below the vertical columns and the layers listed below is substrate 601, an insulating film 654 on the substrate, and source line SL. The NAND string of vertical column 632 has a source end at a bottom of the stack and a drain end at a top of the stack. As in agreement with FIG. 6C, FIG. 6D show vertical column 632 connected to Bit Line 614 via connector 617. Local interconnects 664 and 666 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

In some embodiments, the word lines are read sequentially, which means that the word lines are read either from low to high (e.g., WLL0 to WLL47) or from high to low (e.g., WLL47 to WLL0). It is not required to read the entire set of word lines when reading sequentially. Techniques are disclosed herein for providing compensation for interference caused by adjacent memory cells on target memory cells during a sequential read.

In some embodiments, the read of an individual word line is broken down into separate reads of sub-blocks. Referring again to FIG. 6C, the block is divided into four sub-blocks 620, 630, 640, 650. Thus, the four sub-blocks on one word line layer may be read, prior to reading the four sub-blocks on an adjacent word line layer. In some embodiments, data state information is used to provide compensation on a sub-block basis. For example, data state information for memory cells at WLL35 is kept for each of the four sub-blocks 620-650. Then, when reading sub-block 620 at WLL36 the data state information for sub-block 620 at WLL35 is used to compensate for interference from adjacent memory cells in sub-block 620 at WLL35, when reading sub-block 630 at WLL36 the data state information for sub-block 630 at WLL35 is used to compensate for interference from adjacent memory cells in sub-block 620 at WLL35, etc.

For three dimensional NAND memory arrays having large numbers of word lines, one or more joint regions may be included. The use of a joint can simply the fabrication process and, in some embodiments, allow for sub-block level operations by accessing word lines only above or below the joint. The joint region will often have thicker dielectric region DLJ than between other word lines. As with the source and drain ends, one or more dummy word lines may be included above (DU) and below (DL) the joint.

FIG. 6E depicts a cross sectional view of region 629 of FIG. 6D that includes a portion of vertical column 632. In one embodiment, the vertical columns are round and include four layers; however, in other embodiments more or less than four layers can be included and other shapes can be used. In one embodiment, vertical column 632 includes an inner core layer 670 that is made of a dielectric, such as $SiO_2$. Other materials can also be used. Surrounding inner core 670 is polysilicon channel 671. Materials other than polysilicon can also be used. Note that it is the channel 671 that connects to the bit line. Surrounding channel 671 is a tunneling dielectric 672. In one embodiment, tunneling dielectric 672 has an ONO structure. Surrounding tunneling dielectric 672 is charge trapping layer 673, such as (for example) Silicon Nitride. Other memory materials and structures can also be used. The technology described herein is not limited to any particular material or structure.

FIG. 6E depicts dielectric layers DLL49, DLL50, DLL51, DLL52 and DLL53, as well as word line layers WLL43, WLL44, WLL45, WLL46, and WLL47. Each of the word line layers includes a word line region 676 surrounded by an aluminum oxide layer 677, which is surrounded by a blocking oxide ($SiO_2$) layer 678. The physical interaction of the word line layers with the vertical column forms the memory cells. Thus, a memory cell, in one embodiment, comprises channel 671, tunneling dielectric 672, charge trapping layer 673, blocking oxide layer 678, aluminum oxide layer 677 and word line region 676. For example, word line layer WLL47 and a portion of vertical column 632 comprise a memory cell MC1. Word line layer WLL46 and a portion of vertical column 632 comprise a memory cell MC2. Word line layer WLL45 and a portion of vertical column 632 comprise a memory cell MC3. Word line layer WLL44 and a portion of vertical column 632 comprise a memory cell MC4. Word line layer WLL43 and a portion of vertical column 632 comprise a memory cell MC5. In other architectures, a memory cell may have a different structure; however, the memory cell would still be the storage unit.

Note that the charge trapping layer 673 may extend from one end of the NAND string to the other, and hence may be referred to herein as a continuous charge trapping layer. When a memory cell is programmed, electrons are stored in a portion of the charge trapping layer 673 which is associated with the memory cell. These electrons are drawn into the charge trapping layer 673 from the channel 671, through the tunneling dielectric 672, in response to an appropriate voltage on word line region 676. The Vt of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 6F:
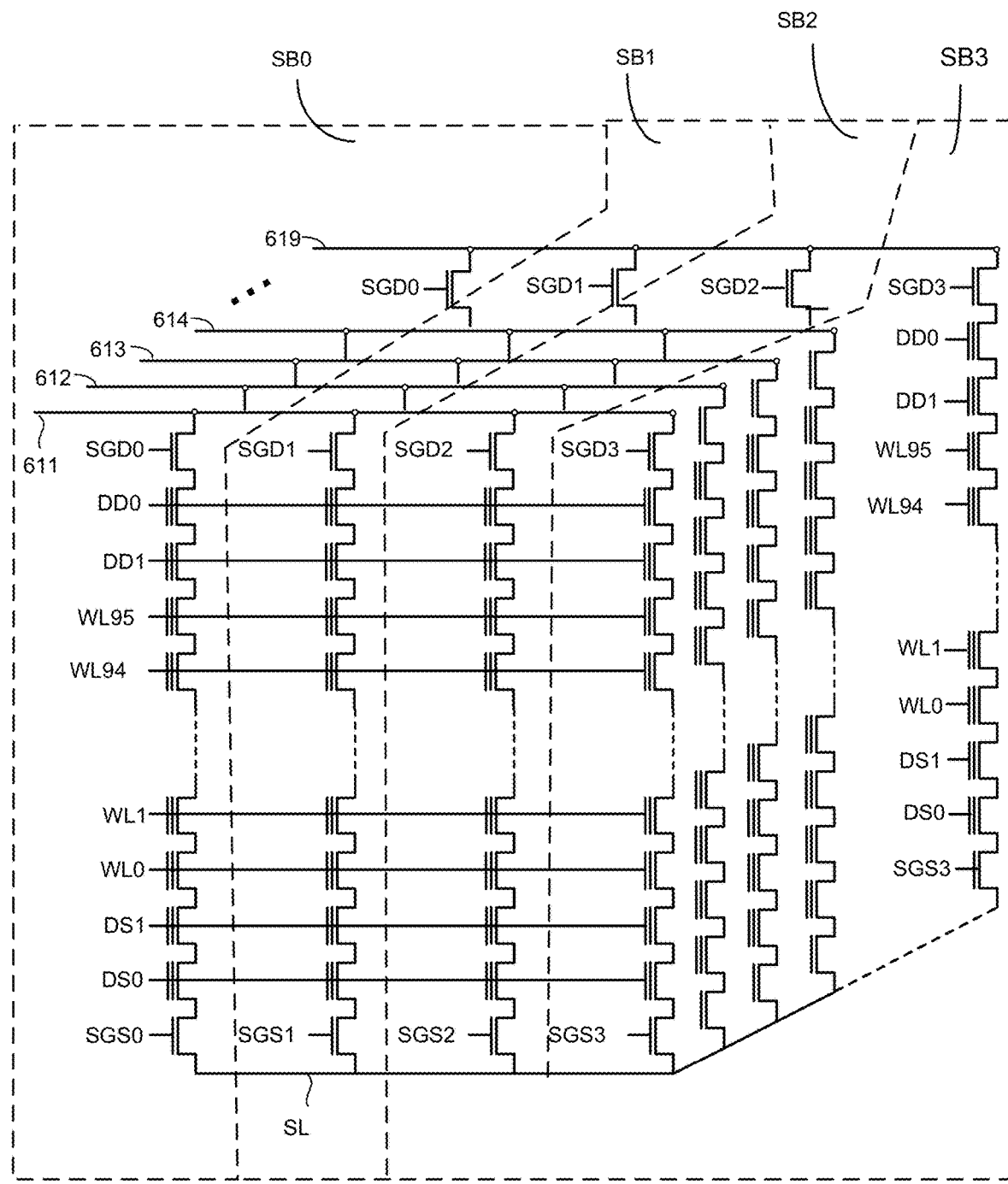
FIG. 6F is a schematic of a plurality of NAND strings showing multiple sub-blocks.

FIG. 6F is a schematic diagram of a portion of the memory depicted in in FIGS. 6A-6E. FIG. 6F shows physical word lines WLL0-WLL95 running across the entire block. The structure of FIG. 6F corresponds to portion 606 in Block 2 of FIGS. 6A-6E, including bit lines 611, 612, 613, 614, . . . , 619. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 6A-6F is a three dimensional memory structure that includes vertical NAND strings with charge-trapping material, other (2D and 3D) memory structures (e.g., MRAM, ReRAM, PCM) can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

FIG. 7A is a graph of threshold voltage versus number of memory cells, and illustrates example threshold voltage distributions for the memory array when each memory cell stores one bit of data. FIG. 7A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store one bit of data are referred to as single level cells ("SLC").

FIG. 7B is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). Memory cells that store more than one bit of data are referred to as multi-level cells ("MLC"). FIG. 7B shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed data states. In some embodiments, data states S1-S7 can overlap, with controller 122 relying on error correction to identify the correct data being stored.

FIG. 7B shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in. In FIG. 7A, read reference voltage Vr is used to test whether memory cells are erased or programmed.

FIG. 7B also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7B represent the full sequence programming. The technology described herein can also be used with other types of programming in addition to full sequence programming including (but not limited to) multiple stage/phase programming.

Each threshold voltage distribution (data state) of FIG. 7B corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 7C is a table describing one example of an assignment of data values to data states. In the table of FIG. 7B, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. Referring back to FIG. 4, in one embodiment the ADL, BDL, and CDL data latches can respectively be used for the lower, middle, and upper page data values of a memory cell during a program operation.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
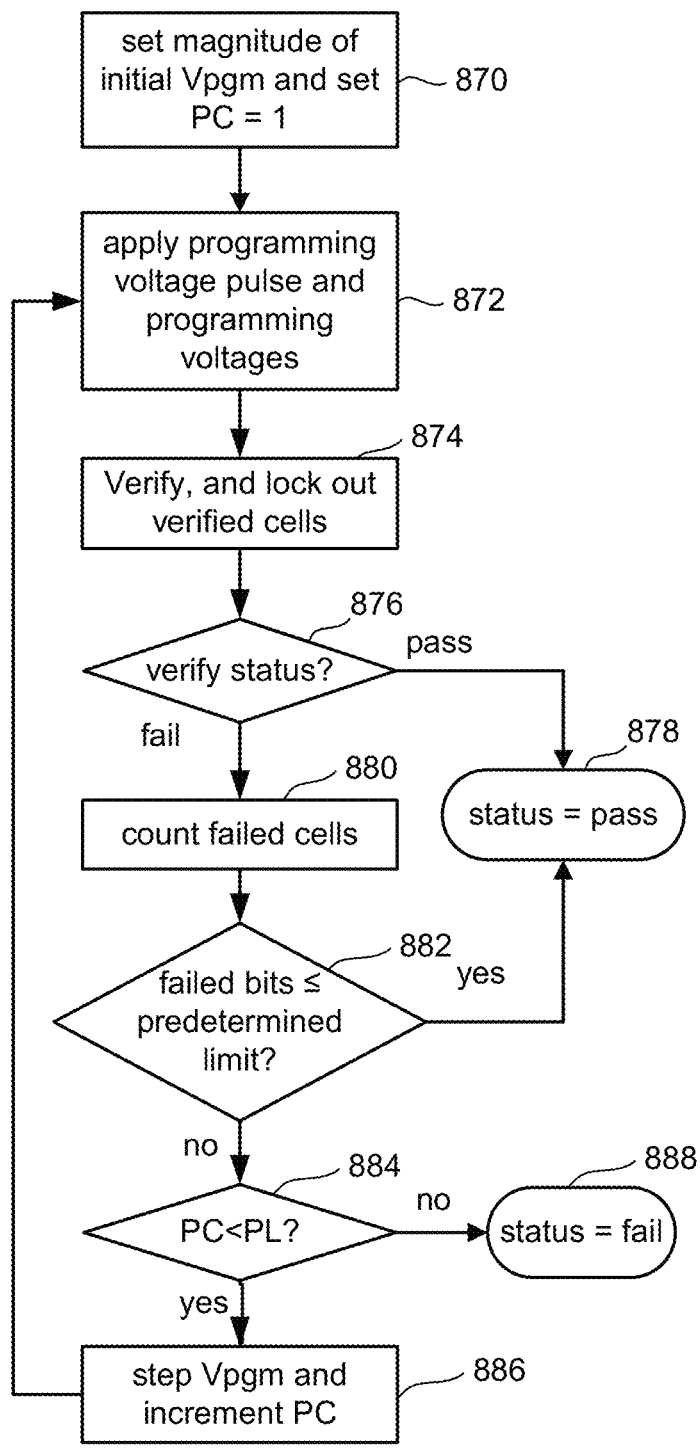
FIG. 8 is a flow chart describing one embodiment of a process for programming non-volatile memory.

FIG. 8 is a flowchart describing one embodiment of a process for programming that is performed by memory die 300/307. In one example embodiment, the process of FIG. 8 is performed on memory die 300/307 using the control circuit discussed above, at the direction of state machine 362. The process of FIG. 8 is performed to implement the programming of FIG. 7A, the full sequence programming of FIG. 7B, or other programming schemes including multi-stage programming. When implementing multi-stage programming, the process of FIG. 8 is used to implement any/each stage of the multi-stage programming process.

Figure 9:
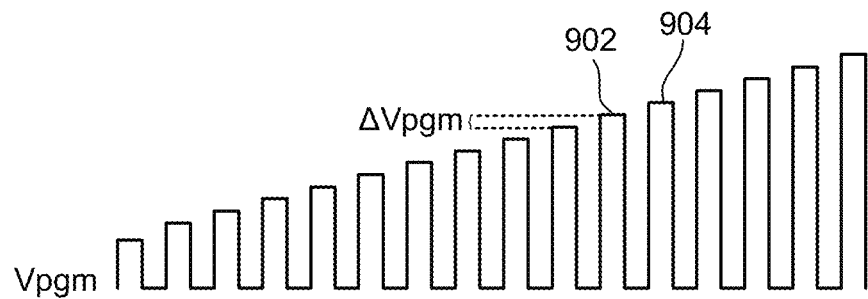
FIG. 9 depicts a series of programming voltage pulses.

Typically, a programming signal Vpgm is applied to the control gates (via a selected word line) during a program operation as a series of programming voltage pulses, as depicted in FIG. 9. Between programming pulses are a set of verify pulses to perform verification. In many implementations, the magnitude of the program pulses is increased with each successive pulse by a predetermined step size ΔVpgm (e.g., 0.2 v-0.5 v). In step 870 of FIG. 8, the programming voltage (Vpgm) is initialized to the starting magnitude (e.g., ~12-16V or another suitable level) and a program counter PC maintained by state machine 362 is initialized at 1. In step 872, a program pulse of the programming signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd (e.g., 1-3.5 volts) to inhibit programming. In step 872, the programming voltage pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 874, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 876, it is determined whether all the memory cells have reached their target threshold voltages (pass). If so, the programming process is complete and successful because all selected memory cells were programmed and verified to their target states. A status of "PASS" (or success) is reported in step 878. If, in 876, it is determined that not all of the memory cells have reached their target threshold voltages (fail), then the programming process continues to step 880.

In step 880, the system counts the number of memory cells that have not yet reached their respective target threshold voltage distribution. That is, the system counts the number of memory cells that have, so far, failed the verify process. This counting can be done by the state machine 362, the controller 102, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 882, it is determined whether the count from step 880 is less than or equal to a predetermined limit. In one embodiment, the predetermined limit is a number of bits that can be corrected by error correction codes (ECC) during a read process for the page of memory cells. If the number of failed cells is less than or equal to the predetermined limit, then the programming process can stop and a status of "PASS" is reported in step 878. In this situation, enough memory cells were programmed correctly such that the few remaining memory cells that have not been completely programmed can be corrected using ECC during the read process. In some embodiments, step 880 will count the number of failed cells for each sector, each target data state or other unit, and those counts will individually or collectively be compared to one or more thresholds in step 882.

In one embodiment, the predetermined limit can be less than the total number of bits that can be corrected by ECC during a read process to allow for future errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, then the programming process continues at step 884 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 888. If the program counter PC is less than the program limit value PL, then the process continues at step 886 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 886, the process loops back to step 872 and another program pulse is applied to the selected word line so that another iteration (steps 872-886) of the programming process of FIG. 8 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the memory system), also referred to as information bits, that is to be stored non-volatile memory structure 302. The informational bits are represented by the matrix i=[1 0] (note that two bits are used for example purposes only, and many embodiments have code words longer than two bits). An error correction coding process (such as any of the processes mentioned above or below) is implemented by ECC engine 226/256 of controller 102 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engine 226/256) to multiple pages encoded across a number of storage elements, but they do not need to be applied across multiple pages. The data bits can be mapped to a logical page and stored in memory structure 302 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

In one embodiment, the GIDL current is generated by causing a drain-to-gate voltage at a select transistor. A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 10:
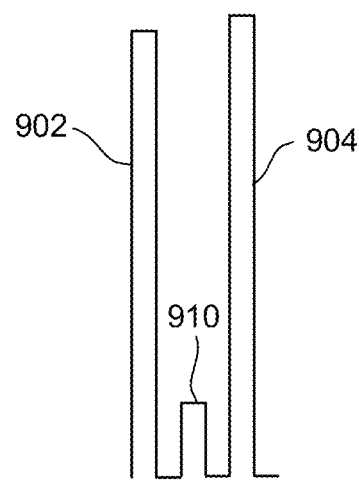
FIG. 10 depicts two programming voltage pulses and a verify voltage pulse.
Figure 11:
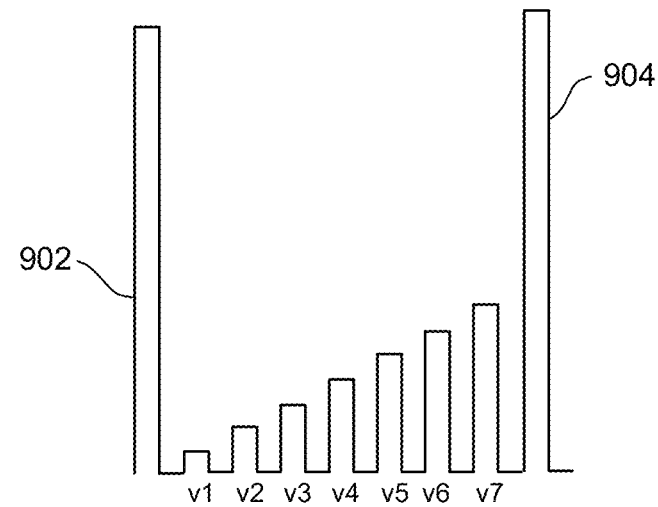
FIG. 11 depicts two programming voltage pulses and a set of verify voltage pulses.

As discussed above, FIG. 9 depicts the programming signal Vpgm as a series of programming voltage pulses. These programming voltage pulses are one example of doses of programming applied to a plurality of non-volatile memory cells being programmed to a data state. As described by FIG. 8, the system performs program verification between the doses of programming, as depicted in FIGS. 10 and 11. FIG. 10, which illustrates an embodiment in which memory cells store one bit of data per memory cell, depicts two of the programming voltage pulses 902 and 904 of FIG. 9. Between programming voltage pulses 902 and 904 is verify voltage pulse 910. In one embodiment, verify voltage pulse 910 has a magnitude of Vv (see FIG. 7A) and represents the system performing program verification (step 874) between the doses of programming (successive iterations of step 872).

FIG. 11, which illustrates an embodiment in which memory cells store three bits of data per memory cell, depicts two of the programming voltage pulses 902 and 904 of FIG. 9. Between programming voltage pulses 902 and 904 are verify voltage pulses v1, v2, v3, v4, v5, v6 and v7. In one embodiment, verify voltage pulse v1 has a magnitude of Vv1 (see FIG. 7B), verify voltage pulse v2 has a magnitude of Vv2, verify voltage pulse v3 has a magnitude of Vv3, verify voltage pulse v4 has a magnitude of Vv4, verify voltage pulse v5 has a magnitude of Vv5, verify voltage pulse v6 has a magnitude of Vv6, and verify voltage pulse v7 has a magnitude of Vv7. Verify voltage pulses v1, v2, v3, v4, v5, v6 and v7 represent the system performing program verification (step 874) between the doses of programming (successive iterations of step 872).

Figure 12:
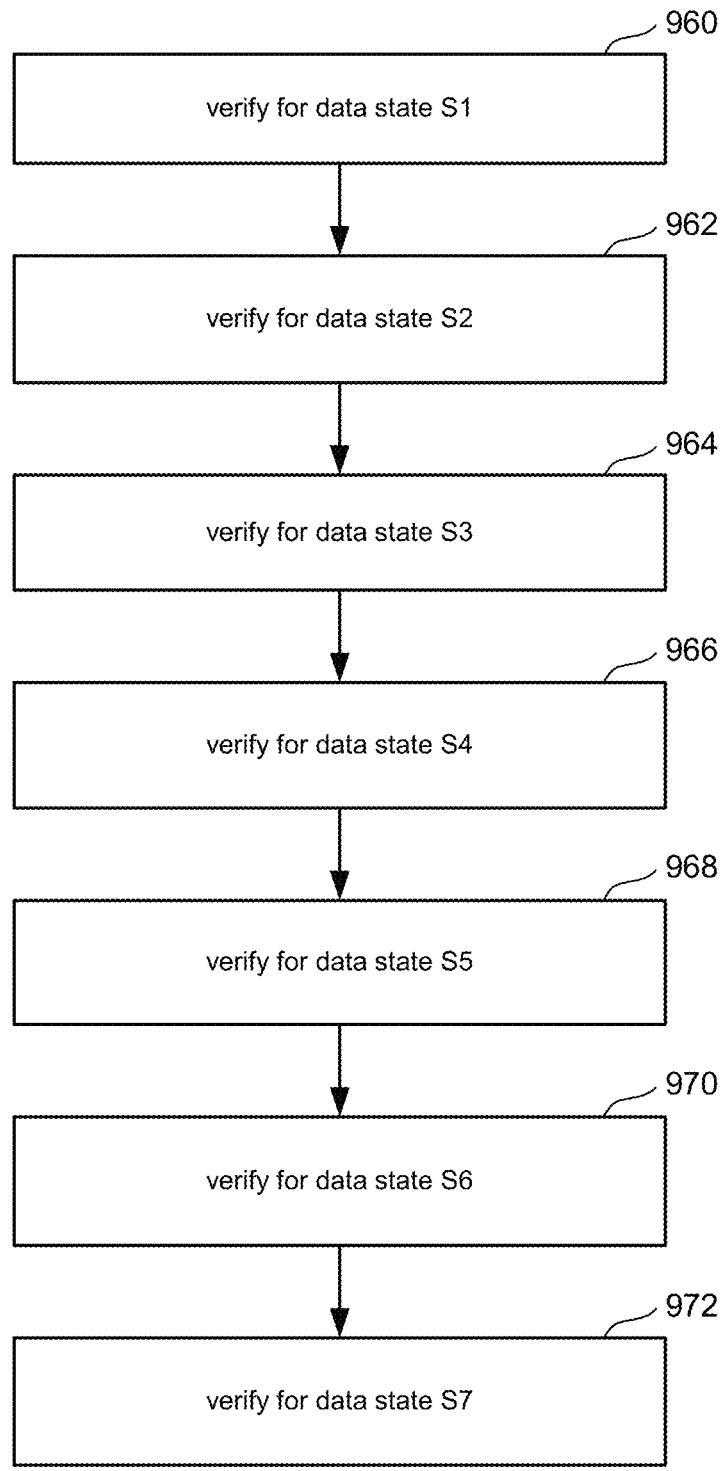
FIG. 12 is a flow chart describing one embodiment of a process for verifying programming of non-volatile memory.

FIG. 12 is a flow chart describing one embodiment of a process for verifying programming of non-volatile memory. That is, the process of FIG. 12 is a process performed during an example implementation of step 874 of FIG. 8 for an embodiment in which memory cells store three bits of data per memory cell. The process of FIG. 12 is performed using the waveforms of FIGS. 9 and 11. In step 960 of FIG. 12, the system performs verification for data state S1. For example, the system tests whether memory cells being programmed to data state S1 have threshold voltages greater than Vv1 (e.g., applying verify voltage pulse v1 of FIG. 11 to the control gates of memory cells being programmed to data state S1).

In step 962, the system performs verification for data state S2. For example, the system tests whether memory cells being programmed to data state S2 have threshold voltages greater than Vv2 (e.g., applying verify voltage pulse v2 of FIG. 11 to the control gates of memory cells being programmed to data state S2).

In step 964, the system performs verification for data state S3. For example, the system tests whether memory cells being programmed to data state S3 have threshold voltages greater than Vv3 (e.g., applying verify voltage pulse v3 of FIG. 11 to the control gates of memory cells being programmed to data state S3).

In step 966, the system performs verification for data state S4. For example, the system tests whether memory cells being programmed to data state S4 have threshold voltages greater than Vv4 (e.g., applying verify voltage pulses v4 of FIG. 11 to the control gates of memory cells being programmed to data state S4).

In step 968, the system performs verification for data state S5. For example, the system tests whether memory cells being programmed to data state S5 have threshold voltages greater than Vv5 (e.g., applying verify voltage pulses v5 of FIG. 11 to the control gates of memory cells being programmed to data state S5).

In step 970, the system performs verification for data state S6. For example, the system tests whether memory cells being programmed to data state S6 have threshold voltages greater than Vv6 (e.g., applying verify voltage pulse v6 of FIG. 11 to the control gates of memory cells being programmed to data state S6).

In step 972, the system performs verification for data state S7. For example, the system tests whether memory cells being programmed to data state S7 have threshold voltages greater than Vv7 (e.g., applying verify voltage pulse v7 of FIG. 11 to the control gates of memory cells being programmed to data state S7). Note that, in one embodiment, steps 960-972 are performed between doses of programming (e.g., between programming voltage pulses). In some embodiments, one or more of steps 960-972 can be skipped between certain programming voltage pulses. In one embodiment, steps 960-972 are performed sequentially (in any order or in the order depicted), while in other embodiments steps 960-972 are performed in parallel (e.g., concurrently).

The flow of FIG. 12 illustrates the verification of all of the target data states, but to speed up the verification phase of a programming operation a "smart verify" operation can be used. In a smart verify, not all of the target data state levels are checked. Initially, for the first few programming pulses, only the lower data states need to be checked. As the programming operation continues, and as the lower target data states begin to verify, additional higher data states are included; and, as the lower states finish, the lower target state verifies can be dropped out.

A program operation can include a single programming pass or multiple programming passes, where each pass uses incremental step pulse programming, for instance. The verify voltages in each program loop, including example verification signals v1-v7 in FIG. 11, can encompass lower assigned data states and then midrange assigned data states and then higher assigned data states as the program operations proceeds. FIG. 11 shows use of all of v1-v7 between pulses 902 and 904, but in a smart verify operation usually only a subset is used. The verify voltages are part of a sensing operation. Memory cells are sensed during the application of the verification signal to judge their programming progress. A verify voltage is used to judge the programming progress of a memory cell. For example, as discussed in the next few paragraphs, FIG. 13 uses verify voltages (plots 1307 and 1308) for the S1 and S2 state, Vv1 and Vv2, respectively. The result of sensing of the Vth relative to its verify voltage can be used to inhibit further programming of a memory cell.

Figure 13:
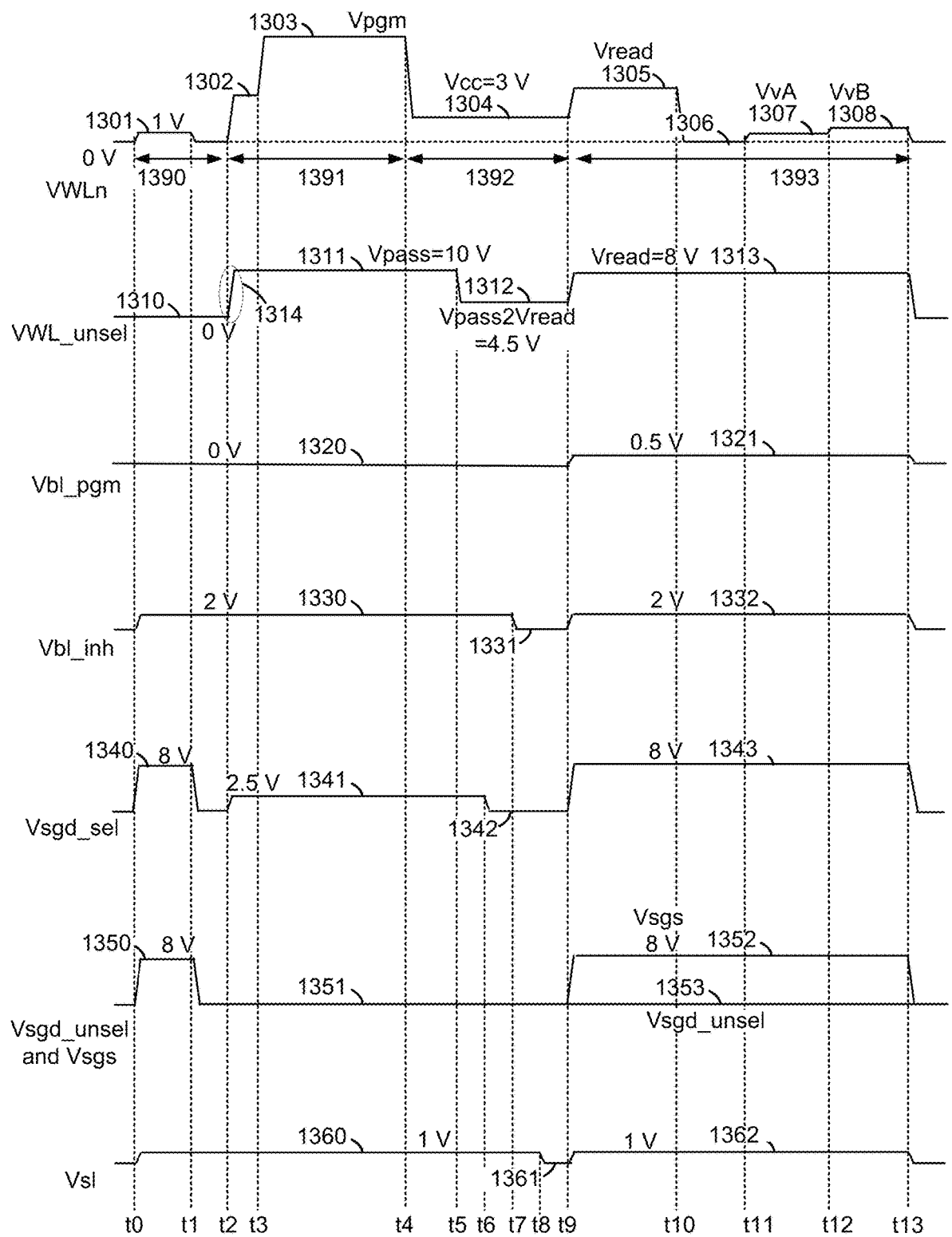
FIG. 13 is an embodiment for a set programming waveforms for NAND memory.

FIG. 13 is an embodiment for a set programming waveforms for NAND memory. In FIG. 13, the vertical dimension denotes voltage and the horizontal dimension denotes time, with time points t0-t13. The period of time depicted corresponds to one program loop and includes a pre-charge phase 1390 (t0-t2), a program phase 1391 (t2-t4), a recovery phase 1392 (t4-t9), and a verify phase 1393 (t9-t13). The voltages depicted are examples.

The top waveform depicts voltages applied to a selected word line, WLn, in a first program loop of a program operation as described with respect to FIGS. 7A-12. A plot 1301 represents 1 V, a plot 1302 represents a program pass voltage, Vpass, a plot 1303 represents a program voltage of Vpgm, a plot 1304 represents a positive recovery voltage of Vcc=3V, a plot 1305 represents a voltage pulse at Vread, a plot 1306 represents 0V, and plots 1307 and 1308 represent example verify voltages VvA and VvB, respectively, where in a first programming loop these could correspond to Vv1 and Vv2 of FIG. 11. During the application of each verify voltage, a sensing operation occurs for the selected memory cells which are assigned to the data state being verified. The selected memory cells are connected to a selected word line, and can be in a selected sub-block. A program pulse comprises the plots 1302 and 1303.

The second waveform depicts a voltage, VWL_unsel, applied to unselected word lines. When programming or reading the memory cell on a selected word line, the non-selected memory cells along a NAND string needs to be turned on sufficiently to allow the programming or sensing for the selected memory cell. A plot 1310 represents 0V, a plot 1311 represents Vpass=10 V, and a plot 1312 represents a positive recovery or transition voltage, Vpass2Vread. This refers to a voltage which is applied in a transition from the program pass voltage to the read pass voltage. A region 1314 represents an increase in VWL_unsel from 0V to Vpass. This ramping region 1314 to the Vpass voltage level will be discussed in more detail below with respect to FIGS. 16A-16C. A plot 1313 represents Vread, where depending on the embodiments, the Vread value used in a verify operation can be the same as used in the sensing operation of a data read.

The third line of FIG. 13 depicts a voltage Vbl_pgm, applied to bit lines of program selected NAND strings, enabling them to create a sufficient channel voltage to increase the stored change level of a memory cell on a selected bit line and selected word line. A plot 1320 represents 1 V, and a plot 1321 represents 0.5 V.

The fourth line of FIG. 13 depicts a voltage Vbl_inh applied to non-selected bit lines of NAND strings to inhibit programming. These are inhibited NAND strings in a selected sub-block. A plot 1330 represents 2 V and a plot 1331 represents 0 V at t7-t9 in the recovery phase. A plot 1332 represents 2 V in the verify phase.

The fifth line of FIG. 13 depicts a voltage Vsgd_sel applied to the drain side select gate SGD transistors of a selected sub-block. A plot 1340 represents 8 V, a plot 1341 represents 2.5 V, a plot 1342 represents 0 V and a plot 1343 represents 8 V.

The sixth line of FIG. 13 depicts voltages applied Vsgd_unsel and Vsgs to SGD transistors of unselected sub-blocks and to SGS transistors. A plot 1350 represents 8 V and a plot 1351 represents 2.5 V for Vsgd_unsel and Vsgs. A plot 1352 represents 8 V for Vsgs and a plot 1353 represents 0 V for Vsgd_unsel.

The bottom line of FIG. 13 depicts a voltage Vsl applied to a source line. A plot 1360 represents 1 V, a plot 1361 represents 0 V and a plot 1362 represents 1 V. In the pre-charge phase, a positive Vbl_inh (plot 1330) is provided to the drain-side channels of the inhibited NAND strings to remove residue electrons and to provide a small amount of boosting such as 1-2 V. The SGD transistors of the selected and unselected sub-blocks are in a conductive state at this time, with a voltage of 8 V, for example. This allows the bit line voltage to be passed to the drain end channel. It is also possible for the SGS transistors of the selected and unselected sub-blocks to be in a conductive state at this time, with a voltage of 8 V, for example to allow Vsl to be passed to the source end of the channel. A plot 1331 represents Vbl_inh returning to 0 V at t7-t9 in part of the recovery phase, and a plot 1332 represents Vbl_inh at 2 V during the verify phase, for example.

In the program phase, VWLn and Vwl_unsel are ramped up, e.g., starting at t2, to provide a capacitive coupling up of the channels of the inhibited NAND strings. VWLn is then ramped up further at t3 to the peak level of Vpgm and held at Vpgm until t4. After the application of the program pulse, the word line voltages are ramped down in the recovery phase. Subsequently, in the verify phase, one or more verify tests are performed by applying one or more verify voltages on WLn and, for each verify voltage, sensing the conductive state of the memory cells in the programmed NAND strings of the selected sub-block. Before the verify tests, VWLn is ramped up with VWL_unsel to equalize the channel potential.

During the program pulse, Vsgd_sel is high enough to provide the selected SGD transistors in a conductive state for the programmed NAND strings, which receive Vbl_pgm=0 V, but low enough to provide the selected SGD transistors in a non-conductive state for the inhibited NAND strings, which receive Vbl_inh=2 V. During the verify phase, the SGD and SGS transistors are in a strongly conductive state to allow sensing to occur for the selected memory cells.

Considering the interval t2-t3 of FIG. 13, all of the word line, both selected and unselected, are ramped up to Vpass prior to applying a programming pulse to a selected word line during t3-t4. As the size of NAND arrays can be very large, having many blocks of memory cells each with many word lines and many NAND strings, the resultant current Icc drawn by the die when concurrently ramping up all of these word lines can result in a large spike in current consumption. It is generally desirable to reduce Icc levels on a memory device and, in particular, to reduce large spikes in current as these peaks can place higher demands on the power control circuitry and driver circuits of a memory die's control circuitry. The following discussion presents techniques to smooth out these peaks when biasing a NAND memory for a programming operation by using different ramp rates for the Vpass voltage for different sets of word lines.

Embodiments for a non-volatile NAND memory can include a Vpass ramp rate parameter, RRC_VPASS, that controls how fast or slowly the Vpass voltage will reach its peak value Vpass that is applied on the unselected word lines in a program operation. This ramp rate also affects the peak current Icc, and corresponding power consumption, during the Vpass ramp period of t2-t3 of FIG. 13. Typically, a faster Vpass ramp rate increases Icc peak values, while slower ramp rates reduces it; however, the impact of this RRC_VPASS parameter depends upon the specific word line as the electrical properties, in particular the RC (resistance-capacitance) value, of different word lines are different. Although having a slower ramp rate will reduce peak Icc values, if a common RRC_VPASS values is used for all word lines, programming performance (i.e., write time, or Tprog) will be penalized. To be able to reduce Icc peak values while minimizing impact on write times, a word line dependent Vpass ramp rate is used.

More specifically, as the RC properties of the word lines of a memory device typically (aside from defects, such as broken word lines or shorts) vary relatively smoothly across the NAND strings, the word lines can be broken down into a number of regions with individually settable Vpass ramp rate values. For a device or device type, the number of word line zones, their size, and boundary locations can be determined as part of a device characterization process. For example, the end word lines, near either the source side or drain side select transistors, may behave differently than the middle word lines, so that the middle word lines can have one RRC_VPASS value and the end word lines another, with the end word lines both having the same RRC_VPASS value or each end word line having different individual values. In NAND memory embodiment with one or more central joint regions (see FIG. 6D), an additional RRC_VPASS may be used for the word lines near the joint region, where the regions above and below the joint (and away from the end regions) can have a common RRC_VPASS or individual values. Depending on the embodiment, the RCC_VPASS values can be determined and set as parameter values on a memory die for all examples of particular device design, for batches of a design, or trimmed for individual devices, where this choice could be based on the amount of process variation in the fabrication process for a circuit design. The RCC_VPASS values can then be set along with other register values for operation parameters for the die, such as stored 366 of FIG. 3A or 3B on the memory die or control die of a die pair. Typically, these parameters could be set along with other parameters as part of the testing and die sort processes for the dies.

Figure 14:
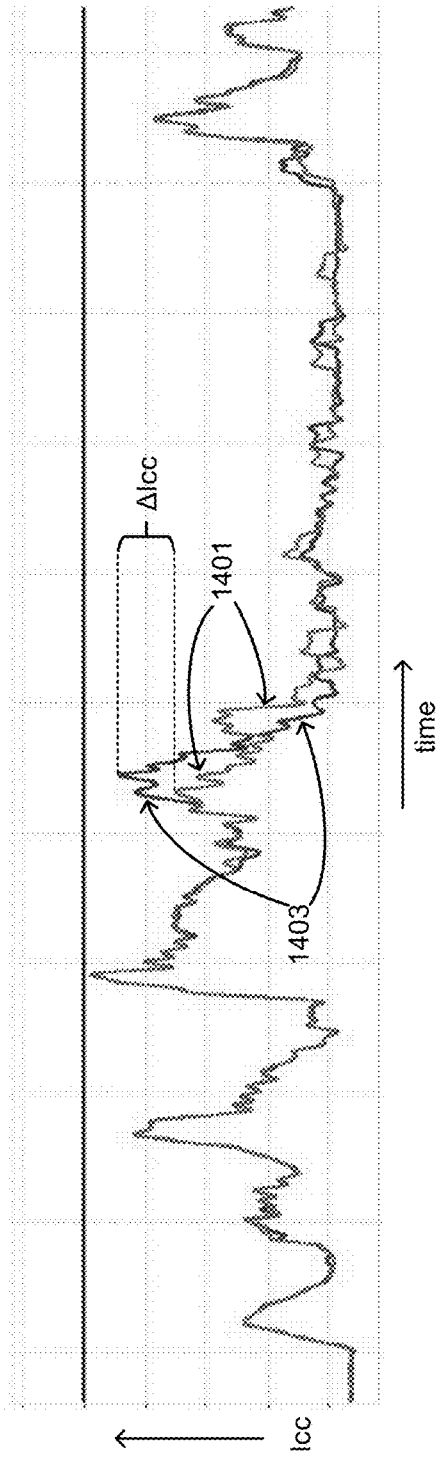
FIG. 14 illustrates the reduction in Icc peak values on an unselected word line by use of a slower ramp rate for the Vpass voltage.

FIG. 14 illustrates the reduction in Icc peak values on an unselected word line by use of a slower ramp rate for the Vpass voltage. FIG. 14 shows two traces of the current Icc drawn by a single unselected word line during a program operation for both a standard Vpass ramp rate and a lower ramp rate. These two waveforms largely overlap, except during the ramp up of Vpass during the interval t2-t3 of FIG. 13 corresponding to the region 1314 of VWL_unsel. In the central region of FIG. 14, the trace 1403 is the Icc for a standard ramp rate of Vpass and shows an initial peak while ramping up and then drops down to a low value. The trace 1401 corresponds to a lower ramp rate, around half the rate, for example, and is initially lower than 1403, but then higher than 1403 as 1401 drops down. The integrated amount of current Icc is similar for both cases, but the peak current during Vpass ramp up is reduced by an amount Ake. For the example of FIG. 14, the peak Icc reduction Ake is ~30%, but the amount will vary from word line to word line depending on the RC value of the word line, such that the peak Icc impact with RRC_VPASS variation is word line dependent and does not impact all word lines the same in terms of peak Icc reduction. For example, on word lines with lower RC values, the lower ramp will have a larger impact on lowering the peak Icc during Vpass ramp up, although this may require a timing change in the t2-t3 interval of FIG. 13. The amount of ramp rate reduction used for the fastest word lines can be selected to balance the amount of Icc peak reduction against its effect on programming performance.

Returning to FIGS. 3A and 3B, the voltages VWLn and VWL_unsel are applied to the word lines by the array drivers 324 of the row control circuitry 320 as selected by the circuitry of the row decoder 322 and block select 326 using voltages provided from power control 364. Many of these voltages applied to the word lines are above the on-die supply level of Vcc. For the example values on FIG. 13, Vcc=3V, while both of Vpass and Vread applied to the unselected word lines are above this value. To generate these higher voltage levels from Vcc, a charge pump can be used.

Figure 15:
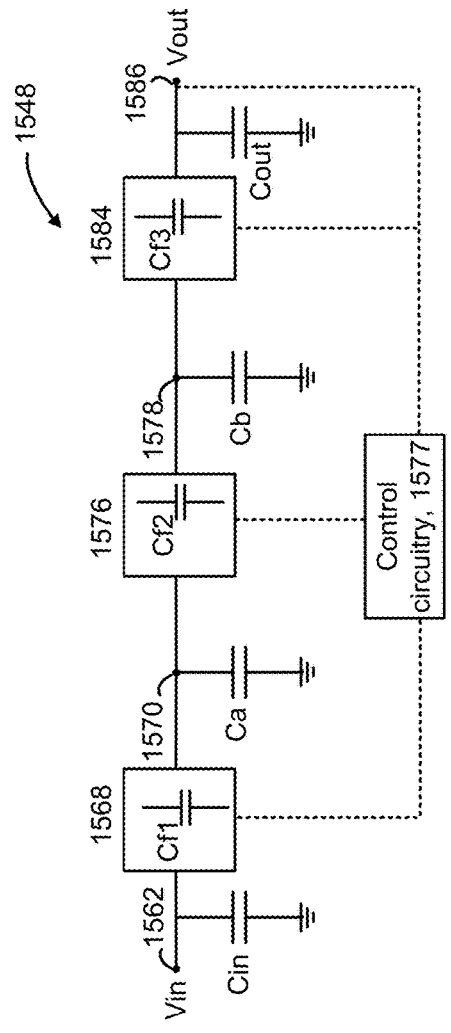
FIG. 15 depicts an example implementation of a multi-stage charge pump that can generate the Vpass voltage level for use of a word line driver for the WL_unsel wave form of FIG. 13.

FIG. 15 depicts an example implementation of a multi-stage charge pump that can generate the Vpass voltage level for use of a word line driver for the WL_unsel wave form of FIG. 13. A charge pump is an example of a voltage driver which can provide a higher output voltage than its input voltage. Vin is provided at input node 1562 and Vout is obtained at an output node 1586. For example, Vin may be a fixed power supply voltage sometimes referred to as Vcc or Vdd in a semiconductor chip. Vout could be a word line voltage, for instance.

As an example, three stages 1568, 1576, and 1584 are provided. Each stage 1568, 1576, and 1584 can include switches and one or more flying capacitors Cf1, Cf2 and Cf3, respectively, such as a MOS (metal oxide semiconductor) capacitor. At the node 1562, charge from the input voltage is maintained in an input capacitor Cin which is connected to a ground node. At a node 1570 which is between the first stage 1568 and the second stage 1576, a capacitor Ca is connected to a ground node. At a node 1578 which is between the second stage 1576 and the third stage 1584, a capacitor Cb is connected to a ground node. Finally, at the output node 1586, an output capacitor Cout is connected to a ground node. A multi-stage charge pump can provide greater flexibility in terms of providing a high output voltage and a greater range of output voltages, compared to a single stage charge pump. Further, each stage can include one or more capacitors to provide even greater flexibility.

The multi-stage charge pump 1548 is operated by control circuitry 1577 which controls switching in each stage. The switches may be MOSFETs, bipolar junction transistors or relay switches, for instance. Based on the switching, charge is transferred from the input node 1562 of the first stage to Cf1, and from Cf1 to the node 1570. Charge is then transferred from the node 1570 of the second stage to Cf2 in the second stage, and from Cf2 to the node 1578. Charge is then transferred from the node 1578 to Cf3 in the third stage, and from Cf3 to the output node 1586.

Generally, each stage of the charge pump operation includes two main phases: charging the flying capacitor from the input node, and discharging the flying capacitor into the output node. During each phase, some switches are closed (conductive), connecting the flying capacitor to either the input node, the output node, or a ground node. The control circuitry 1577 may communicate with the output node 1586 as well such as to detect its level and to make adjustments in the charge pump. For example, a switching frequency can be reduced if Vout is above a target voltage, or increased if Vout is below the target voltage. As discussed further in connection with FIGS. 17A and 17B, Vout is proportional to the switching frequency. Note that the circuits shown are examples only, as various modifications can be made. Many different charge pump designs exist and other types of voltage driver circuits could be used as well.

Figure 16A:
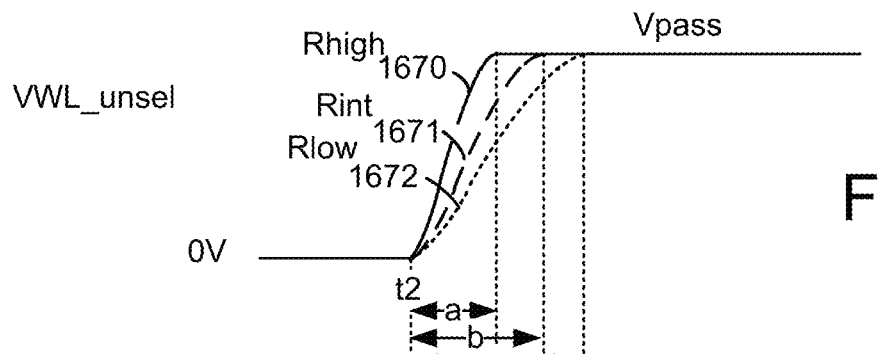
FIGS. 16A-16C depict example voltage signals consistent with the region 1314 of VWL_unsel of FIG. 13 during the interval t2-t3.
Figure 16B:
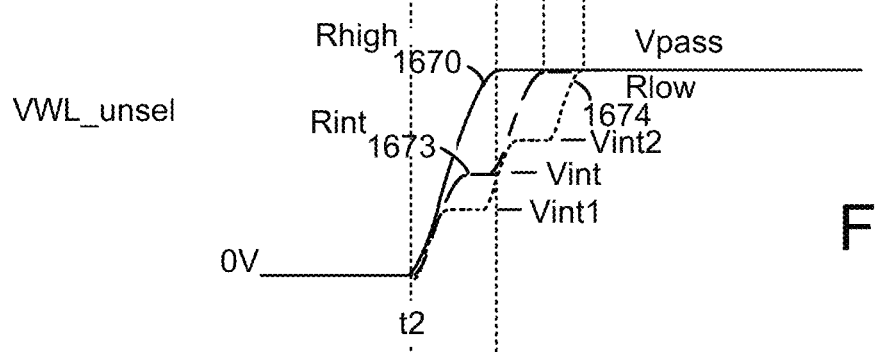
Figure 16C:
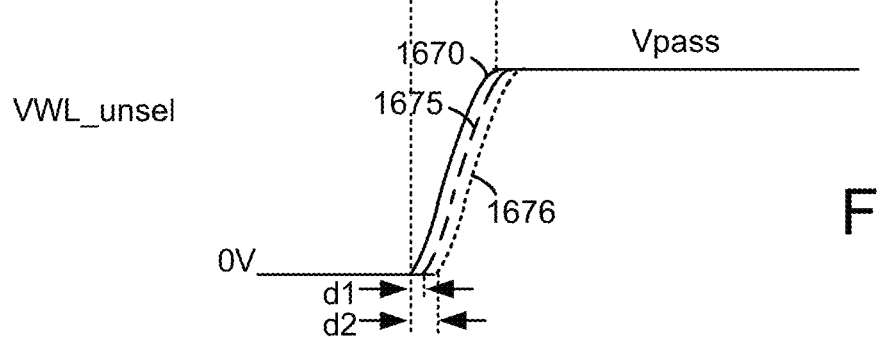

FIGS. 16A-16C depict example voltage signals consistent with the region 1314 of VWL_unsel of FIG. 13 during the interval t2-t3. FIG. 16A depicts example voltage signals consistent with the region 1314 of FIG. 13, where there is a continuous increase in the voltage signals (plots 1670-1672), and example rates of increase are Rhigh (a high rate), Rint (an intermediate rate between Rhigh and Rlow) and Rlow (a low rate), respectively. The peak current consumption is believed to be due to the voltage driver for the unselected word lines and can be reduced by reducing the ramp up rate. For example, the peak current consumption is highest with Rhigh, lower with Rint and even lower with Rlow. While this example illustrates three ramp up rates, in general, two or more may be used, such as the eight values of Table 1 below. As discussed with FIGS. 17A and 17B, a clock rate of the voltage driver can be adjusted to adjust the ramp up rate. When the ramp up rate is decreased, the time period in which the voltage increases from 0V to Vpass increase. For example, with Rhigh, Rint and Rlow, the time period is a, b or c, respectively. Each voltage signal can start to increase concurrently at t2 in this example, but will require different amount of time to reach Vpass.

FIG. 16B depicts example voltage signals of an alternate embodiment consistent with the region 1314 of FIG. 13, where there is a continuous increase in the voltage signal (plot 1670), a stepped increase in the voltage signals (plots 1673 and 1674), and example rates of increase are Rhigh, Rint and Rlow, respectively. This is another example of reducing the ramp up rate. As an alternative to a continuous increase, a stepped increase can be used, as in plots 1673 and 1674. Generally, two or more steps can be used. The voltage signal (plot 1673) includes a first increase from 0V to an intermediate level, Vint, between 0V and Vpass, followed by a period in which the voltage output is constant at Vint, followed by a second increase from Vint to Vpass. The voltage signal 1674 includes a first increase from 0V to a first intermediate level, Vint1, followed by a period in which the voltage output is constant at Vint1, followed by a second increase from Vint1 to a second intermediate level, Vint2, followed by a period in which the voltage output is constant at Vint2, followed by a third increase from Vint2 to Vpass. Each voltage signal starts to increase concurrently at t2.

FIG. 16C depicts another alternate embodiment for example voltage signals consistent with the region 1314 of FIG. 13, where a start of an increase in the voltage signals 1675 and 1676 is delayed relative to a start of an increase in the voltage signal 1675 by d1 and d2, respectively. By offsetting the voltage signals for different groups of unselected word lines, the peak current consumption can be reduced, since the load on the voltage drivers is spread out in time. Moreover, a capacitance between the word lines and the memory hole is reduced. Generally, offset voltage signals for two or more groups of word lines can be used. This example includes three groups of word lines. Each voltage signal has a continuous increase from 0V to Vpass in this example, but other options are possible, such as a stepped increase. The voltage signal (plot 1670) starts to increase at t2. After a delay of d1 relative to t2, the voltage signal 1675 starts to increase. After a delay of d2 relative to t2, the voltage signal 1676 starts to increase.

In the embodiments presented here, the same Vpass voltage level is used for all unselected word lines, but in other embodiments, different Vpass levels are sometimes used for different word lines, either based on their location along the NAND strings or on their location relative to the selected word line. In these cases, the parameters used for determining the different ramp rates can be independent of final Vpass voltage level of a word line.

Figure 17A:
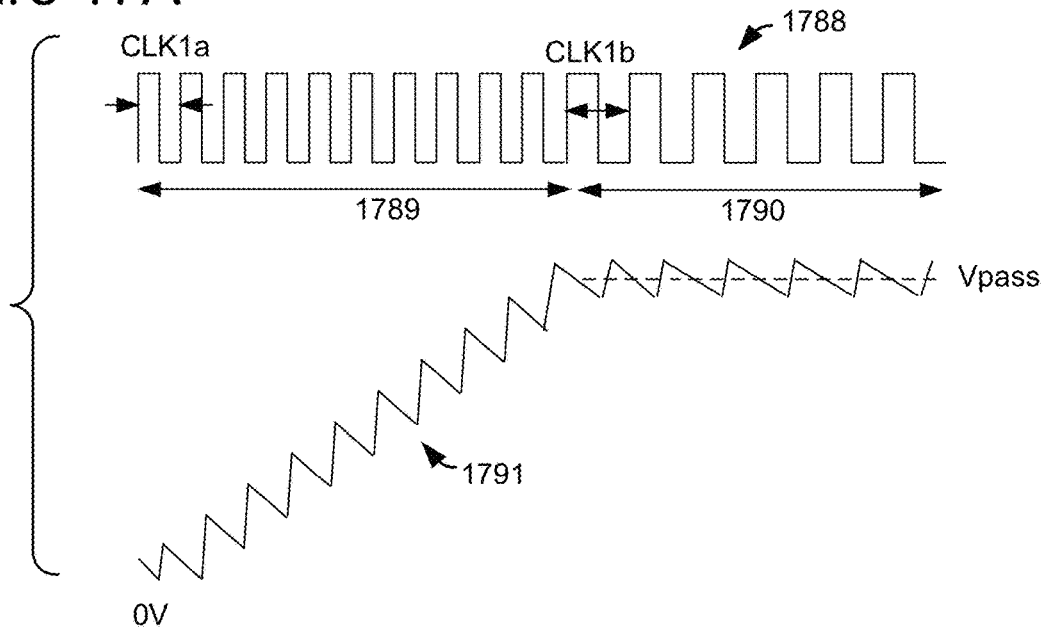
FIGS. 17A and 17B depict two example clock signals that can used to achieve different ramp rates as in FIG. 16A for the charge pump of FIG. 13.
Figure 17B:
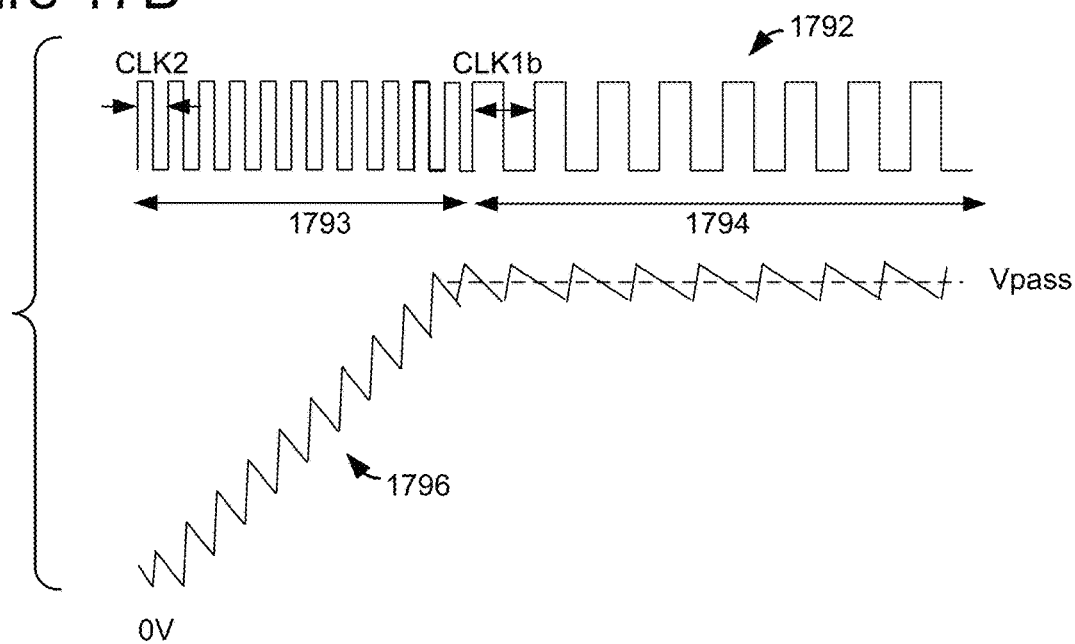

FIGS. 17A and 17B depict two example clock signals that can used to achieve different ramp rates as in FIG. 16A for the charge pump of FIG. 13. FIG. 17A depicts an example clock signal 1788 and output voltage 1791 of the charge pump of FIG. 13 where a lower ramp up rate (Rlow) is used, e.g., lower relative to the example of FIG. 16A. The clock signal is provided by the control circuitry 1577 to activate switches in the stages of the charge pump. The output voltage increases with each charge period, starting from 0V and ending at Vpass, for example, e.g., 8V-10V. The output voltage has a ripple shape due to the repeated charging and discharging of the capacitors in the charge pump. The clock signal has period CLK1*a* in a time period 1789 in which the output voltage increases. The clock signal then changes to have a period CLK1*b*>CLK1*a* in a time period 1790 when the output voltage reaches Vpass, and the output voltage subsequently remains at Vpass. The output voltage can return to 0 V or other initial level at a designated time.

FIG. 17B depicts an example clock signal 1792 and output voltage 1796 of the charge pump of FIG. 15 where a higher ramp up rate (Rhigh) is used, relative to the example of FIG. 17A. The output voltage increases with each charge period, starting from 0 V and ending at Vpass, for example. The clock signal has period CLK2<CLK1a in a time period 1793 in which the output voltage increases. The clock signal then changes to have the period CLK1b>CLK2, as in FIG. 17A, in a time period 1794 when the output voltage reaches Vpass, and the output voltage subsequently remains at Vpass.

To reduce Icc peak levels during the biasing of the word lines of a NAND memory array during a programming operation while avoiding a large programming time penalty, embodiments presented here implement a word line dependent Vpass ramp rate (RRC_VPASS). The word lines of an array are broken up into a number of contiguous zones based on the word lines RC values, where the ramp rates of the zones can be trimmed during the die sort process for a given set of devices. The electrical properties of the word lines (i.e., the word lines RC values) typically are fairly consistent across a range of word lines, except near the source or drain ends or near joint regions (see FIG. 6D) within the structure. This can be illustrated with respect to FIG. 18.

Figure 18:
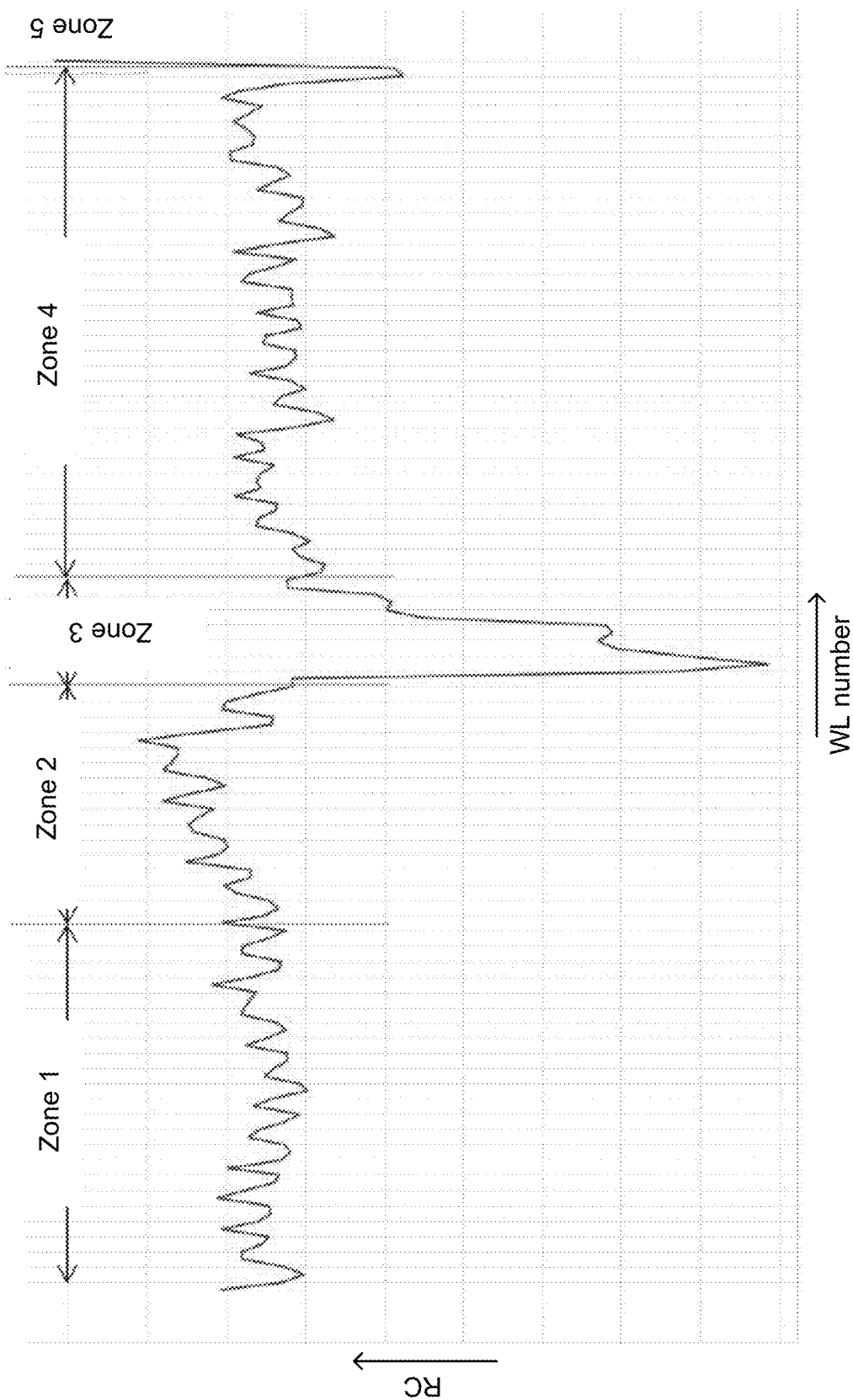
FIG. 18 is an example of the variance in RC values across the word lines of a NAND memory array having a central joint region.

FIG. 18 is an example of the variance in RC values across the word lines of a NAND memory array having a central joint regions. In the plot of FIG. 18, the horizontal axis is word line number (indexed starting from the source side as in FIG. 6A-6F) for an embodiment of ~160 word lines having one central joint (as illustrated in FIG. 6D). The horizontal axis is the RC value of the word lines, where it should be noted that the bottom of the figure does not stat at 0; rather the fluctuations in, for example, zone 1 are about a 2-3% variation and the larger dip for zone 3 is a ~25% variation. The word line RC data in FIG. 18 is from test data of an actual device fabricated according to an embodiment for a set of processing parameters. The RC values for the parameters in this example are separated into 5 zones of similar RC values: Zone 1 on the source end of about 1/4 of the word lines; Zone 2 of about an eighth or so of the word lines in a central region between Zone 1 and the word line near a joint region; Zone 3 of a set of word lines around the central joint; Zone 4 of word lines above the joint region, but not the last few word lines near the drain side select gates; and Zone 5 of a few word lines on the drain end. The number of RC value zones will depend on the die design and processing, but a typical result will be one zone near each of the drain side and the source side, a zone around any intermediate joint regions, and intermediate zones away from the ends and joints of the NAND strings. The Vpass ramp rate (RRC_VPASS) values can then be selected based on the RC values of the zones, with higher RC zones having a higher ramp rate and lower RC zones having a lower ramp rate. As a result, not all of the zones require a higher RRC_VPASS value, which can save on a programming time penalty.

The Vpass ramp rate (RRC_VPASS) for a given die can be stored along with other operating parameters that are set as part of the testing/die sort/initialization operations performed on the devices before they are assembled into packages or otherwise shipped from the manufacturer or test center. Referring back to FIGS. 3A and 3B, these parameters can be set in the registers of the system control logic's storage 366. In one embodiment, the RRC_VPASS parameter can be a three bit value corresponding to different ramp rate scale factors, either increasing or decreasing the ramp rate relative to a base rate (i.e., ×1.00). Table 1 illustrates an example of one embodiment. Referring back to the example of FIG. 18, Zone 1 can be (011), Zone 2 can be (110), Zone 3 can be (000), Zone 4 can be (010), and Zone 5 can be (111).

TABLE 1

| RRC_VPASS parameter | Ramp rate scale factor |
| --- | --- |
| 000 | x0.25 |
| 001 | x.050 |
| 010 | x0.75 |
| 011 | x1.00 |
| 100 | x1.50 |
| 101 | x1.75 |
| 110 | x2.00 |
| 111 | x2.25 |

The above embodiments have considered the ramp rate of the unselected word lines from 0V to Vpass between t2 and t3 of FIG. 13 as indicates at 1314. These techniques can be similarly applied when the unselected word line are ramped up to Vread during t9-t10. In some embodiment the ramping starts at an intermediate voltage (Vpass2Vread in the embodiment of FIG. 13) rather than being discharged to 0V, and Vread can be some lower that Vpass, so that the amplitude of the voltage change during ramping is less than in the Vpass case, although given the large number of word lines that are ramped up concurrently a significant spike in Icc can still occur. Consequently, more generally, when a selected word line is being accessed in the NAND architecture, whether for a programming operation pulse or for a sensing operation (both a verify and a data access read), word line dependent ramp rates for the unselected word lines can reduce spikes in the current used by the memory die.

Figure 19:
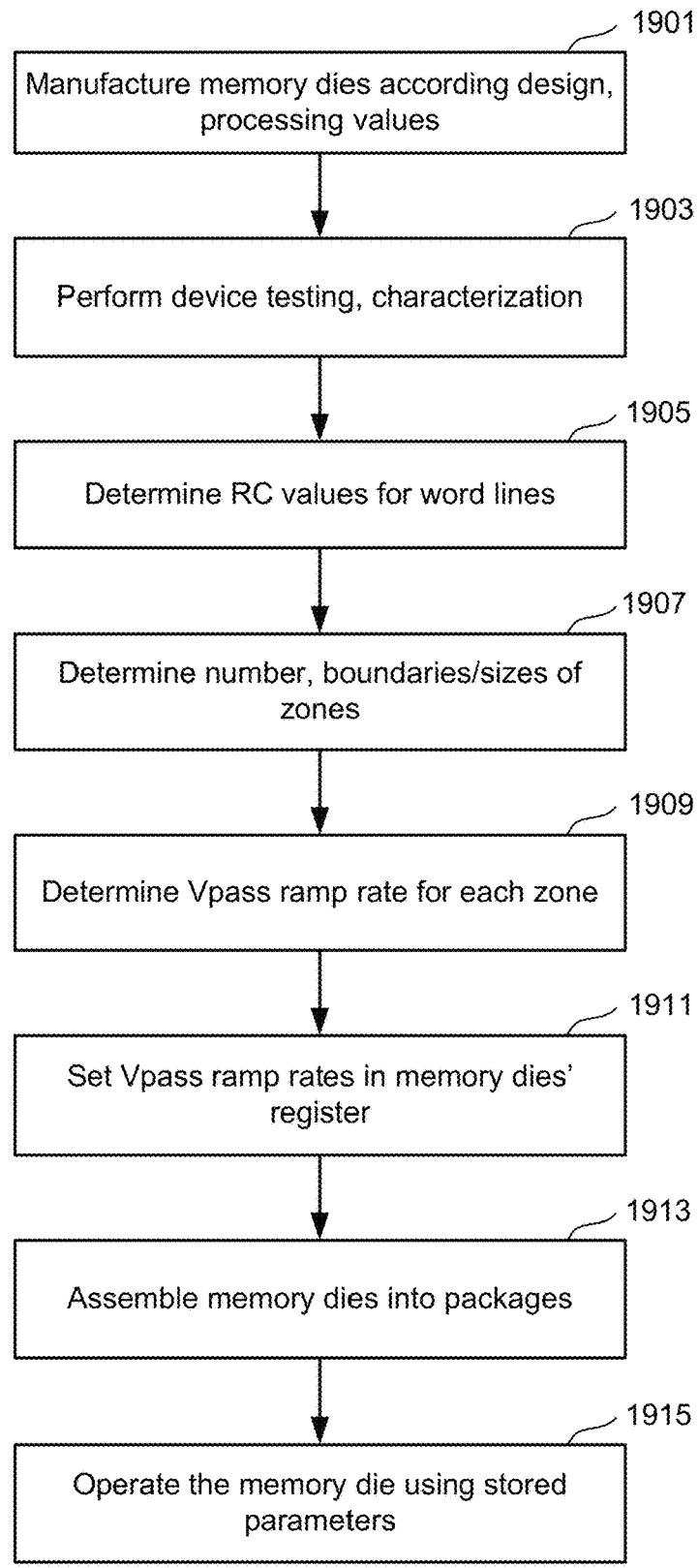
FIG. 19 is a flowchart for an embodiment for determination and use of a non-volatile memory device with word line dependent ramp rates for pass voltages.

FIG. 19 is a flowchart for an embodiment for determination and use of a non-volatile memory device with word line dependent ramp rates for pass voltages. Starting at step 1901, a number of NAND memory die are manufactured, where these can be the memory die 300 of FIG. 3A or the memory die 301 of FIG. 3B. These die are fabricated according to a specified design and set of values for the processing parameters used in the fabrication process. At step 1903, the memory die is tested to characterize the devices properties, where this is typically done for a representative subset of devices. From the device characterization testing, electrical properties, including RC values of the word lines, of the test die are determined at step 1905.

Once RC values for the word lines are determined for the sample set of devices, at step 1907 a determination of the number of word line zones, the boundaries of these zones, and consequent size of these zones are determined, where this can be a manual process, an automated process, or a combination of these depending on the embodiment. For example, based on the word line RC data illustrated in FIG. 18, around 5-10% of the word lines in the central region around the joint structure are assigned to one zone (Zone 3), with another one or more zones to either side. Above the joint, the range of RC values is fairly well contained until near the drain side select gates and these word lines are assigned to one zone (Zone 4), with the last few high RC value word lines assigned to their own zone (Zone 5). Below the joint, two zones are used, with a larger zone (Zone 1) on the source end and a somewhat smaller zone (Zone 2) for the region of somewhat higher RC values between Zone 1 and Zone 3. The number and boundaries of the zones can be chosen differently for different device designs and set of production runs. For example, in a NAND architecture with a single central joint region, it may be found that five zones are typically needed, although the boundaries on these zones may differ for different manufacturing runs or changes in processing parameters. The zones of word lines will typically be sets of multiple contiguous word lines, as in the five zone example here, although in some cases a zone could be a single word line or include more than one ranges of contiguous word lines. For example, in a NAND structure with a central joint, in some case the central word lines to either side of the joint (similar to the regions of Zone 2 and Zone 4 in FIG. 18) could a use a single ramp rate parameter for both regions.

Once the zones are established in step 1907, the ramp rates for each of the zones can be determined at step 1909. Based on a mean or other average for the RC values of a zone's word lines, a Vpass ramp rate parameter can be determined and set in the devices' register for the memory dies, such as in the registers of the storage 366 of the system control logic 360, at step 1911. These values can be used for examples of the device made at the same time at the examples used for steps 1903, 1905, and 1907, or fabricated subsequently according to the same fabrication processing and parameters. In the embodiment of Table 1 above, the RRC_VPASS parameter is a three bit value, but other embodiments can use other numbers of bits. Table 1 also shows a particular set of ramp rate scale factor values, but other embodiments can determine or use other sets of scale factors. The setting of the ramp rate scale factor values in the devices registers can be performed during the die sort process when other operating parameters of the devices are set. In some embodiments, the ramp rate scale factor values for individual devices can be individually trimmed.

Once the memory dies have been had their operation parameters set and other pre-shipping preparation of the individual die done, these may be assembled into packages, such as illustrated with respect to FIGS. 5A and 5B, at step 1913. In such a package, there may be memory die from different fabrication runs that will have differing sets of zones and/or ramp rate scale factor values for the zones. The multi-die memory package can then be put into operation by an end user, with each of the die using its corresponding set of ramp rate scale factor values, at step 1915.

As discussed above with respect to FIGS. 7A and 7B, NAND memory can be operated in both a binary (single level cell, or SLC) format or a multi-level cell (MLC) format in which each memory cell stores multiple bits of data, such as 3 or 4 bits per cell. The algorithms for performing SLC and MLC programming can differ in a number of ways. For example, referring to FIGS. 9-13, in an MLC write operation there will typically be multiple verify operations between programming pulses. The step size between programming pulses ($\Delta$Vpgm in FIG. 9) can differ between MLC and SLC, as MLC will typically use a finer resolution of threshold voltage distributions. An MLC write will often require more programming loops. Consequently, for a number of reasons, the amplitude and timing of Icc peaks in an SLC write operation will typically differ from those of an MLC write operation. To address this issue, the use of different ramp rates for applying Vpass to unselected word lines can be applied to MLC and SLC programing of NAND memory. Additionally, differential timings can be applied to the Vpass ramp time durations (i.e., t2-t3 in FIG. 13) for MLC and SLC programming.

More specifically, as discussed above, a parameter RRC_VPASS can be used to control how fast or slow the Vpass voltage will reach its peak Vpass that is applied on the unselected word lines, but this ramp rate also impacts the power consumption as faster ramp rates typically increase Icc peaks while slower ramp rates reduces it. However, relaxing the RRC_VPASS parameter value can degrade program performance (write time, of tPROG) and in order to maintain same reliability (Vt margins), it may be needed to relax timing as well, where the impact of such tPROG degradation can be different between MLC and SLC. The following discussion presents the use of separate RRC_VPASS and timing parameters for MLC and SLC so that the ICC/tPROG trade-off between TLC and SLC can be separately evaluated. The use of the different parameters for MLC and SLC programming can be illustrated with respect to FIG. 20.

Figure 20:
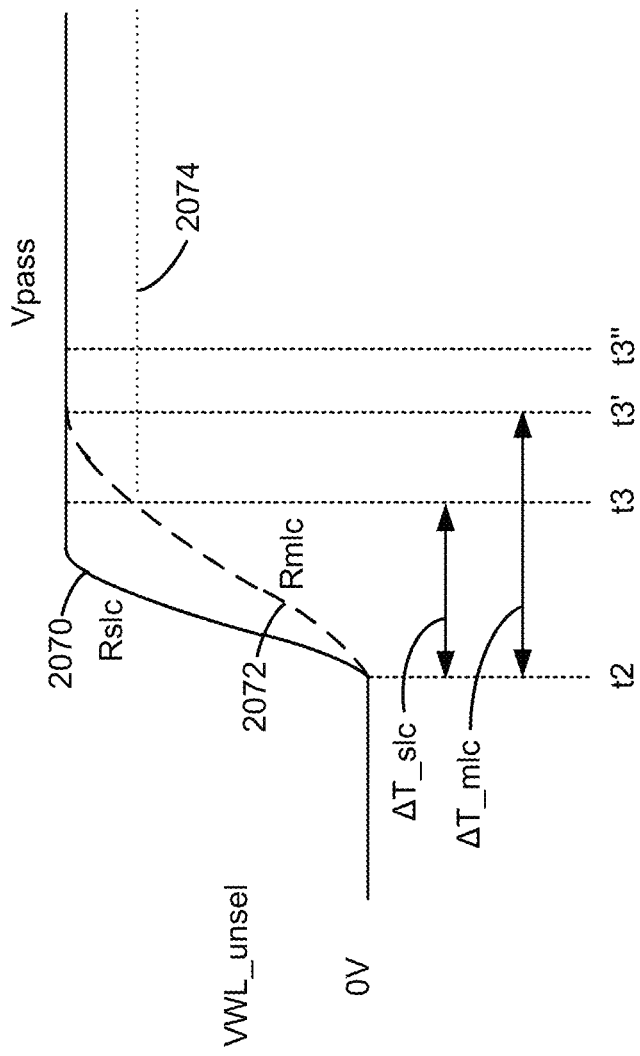
FIG. 20 illustrates an embodiment for differential ramp rates and timings for MLC and SLC for the biasing of unselected word lines during a programming operation.

FIG. 20 illustrates an embodiment for differential ramp rates and timings for MLC and SLC biasing of unselected word lines during a programming operation. FIG. 20 is arranged similarly to FIG. 16A and much of the discussion there can be applied to this example, but now with two ramp rates for the program unselected word lines, Rslc 2070 and Rmlc 2072. This example uses a more relaxed waveform for MLC than SLC, as SLC programming will often have less pronounced Icc peaks, but this can vary based on the design and fabrication specifics. As with the differential ramp rates for word lines, alternate embodiments for the MLC/SLC case can be based on embodiments similar to those of FIGS. 16B, 16C, or combinations of the embodiments of FIGS. 16A, 16B, and 16C. Additionally, although the use of different ramp rates for MLC/SLC operation and for different word line groups are presented separately, in some embodiments they can be combined.

As illustrated in FIG. 20, the ramp rates for MLC operation and SLC operation can be determined and stored separately as the parameter value pairs (RRC_VPASS_MLC, RRC_VPASS_SLC). Depending on the embodiment, a single set of parameters can be used for all arrays of a die or each array can have its own set of parameters. An example of parameter values is illustrated in Table 2, where the selection of parameter values can again be done at device characterization. In the example of Table 2, a 3-bit value is again used for both the MLC and SLC values. In Table 2, the ramp rate scale factor for a given parameter value are the same for both MLC and SLC, but in other embodiments these can be different. If it is known that a memory die will be configured for, and only operated in, one of the SLC or MLC mode of operation, in some embodiments only the appropriate parameter value needs to be determined and set in the registers.

TABLE 2

| RRC_VPASS_MLC parameter | Ramp rate scale factor | RRC_VPASS_SLC parameter | Ramp rate scale factor |
|---|---|---|---|
| 000 | x0.25 | 000 | x0.25 |
| 001 | x.050 | 001 | x.050 |
| 010 | x0.75 | 010 | x0.75 |
| 011 | x1.00 | 011 | x1.00 |
| 100 | x1.50 | 100 | x1.50 |
| 101 | x1.75 | 101 | x1.75 |
| 110 | x2.00 | 110 | x2.00 |
| 111 | x2.25 | 111 | x2.25 |

FIG. 20 also illustrates a separation in timing for MLC and SLC, where different values of $\Delta T=(t3-t2)$ are used. Referring back to FIG. 13, the time t2 to t3 should be long enough for the unselected word lines, or at least non-defective word lines, to be at or near Vpass, as well as other bias levels to be set and reasonably settled before Vpgm is applied to the selected word line WLn. Using a longer ΔT can allow complete ramping up to Vpass and stabilization of voltage level, but increase programming times, while a shorter ΔT can affect programming accuracy.

To account for different ramp times and differences in algorithms and behavior between MLC and SLC operations, in addition to settable ramp rates, some embodiments can additionally or alternately have a settable parameter for ΔT for MLC versus SLC operation. For SLC operation with the ramp rate Rslc at 2070, t3 could be used, as Vpass is reached with a margin for settling and slower word lines. However, for the MLC ramp rate Rmlc of 2072, the unselected word line only reaches the bias level 2074 by t3, which may adversely affect write accuracy or require additional programming loops. Instead, for the MLC ramp rate Rmlc of 2072 the value t3' can be used, or even t3", to allow for settling and slower word lines. Table 3 illustrates an example for setting parameter value pairs (ΔT_mlc, ΔT_slc) for the value of t3 relative to t2, where MLC and SLC operation are independently settable. As with the ramp rate parameters, these interval values can be stored in the registers of the storage 366 of the system control logic 360 of FIG. 3A or 3B. Table 3 again uses as 3-bit embodiment for both MLC and SLC, and uses the same scale factors for both, but other embodiments can use different values for these. If it is known that a memory die will be configured for, and only operated in, one of the SLC or MLC mode of operation, in some embodiments only the appropriate parameter value needs to be determined and set in the registers.

TABLE 3

| ΔT_mlc parameter | ΔT scale factor | ΔT_slc parameter | ΔT scale factor |
| --- | --- | --- | --- |
| 000 | x0.7 | 000 | x0.7 |
| 001 | x0.8 | 001 | x0.8 |
| 010 | x0.9 | 010 | x0.9 |
| 011 | x1.0 | 011 | x1.0 |
| 100 | x1.1 | 100 | x1.1 |
| 101 | x1.2 | 101 | x1.2 |
| 110 | X1.3 | 110 | X1.3 |
| 111 | X1.4 | 111 | X1.4 |

Figure 21:
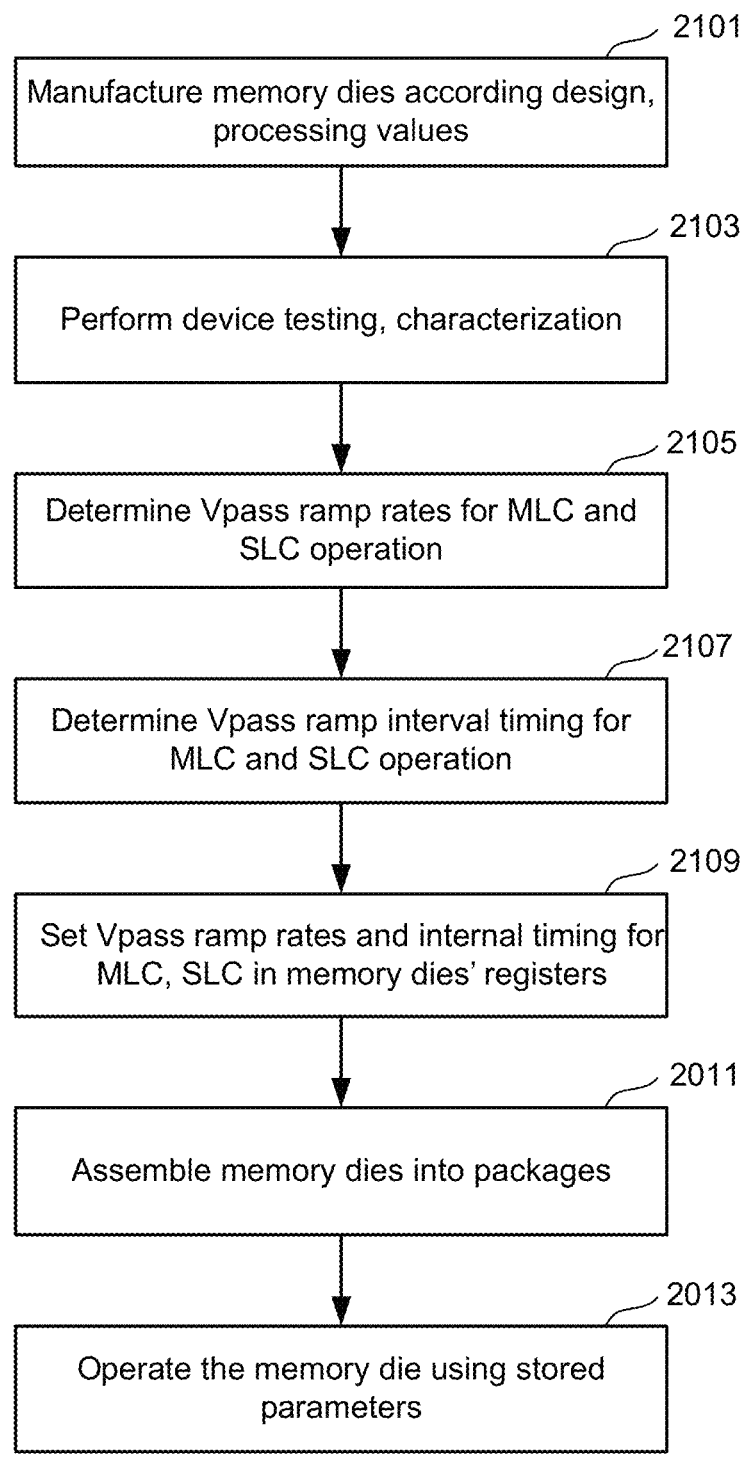
FIG. 21 is a flowchart for an embodiment for determination and use of a non-volatile memory device with independently settable ramp rate and ramp rate timing values for pass voltages for MLC and SLC operation.

FIG. 21 is a flowchart for an embodiment for the determination and use of a non-volatile memory device with independently settable ramp rate and ramp rate timing values for pass voltages for MLC and SLC operation. The flow of FIG. 21 is similar to that of FIG. 19 and in an embodiment also incorporating word line dependent ramp rates, the two flows can be combined. Starting at step 2101, a number of NAND memory die are manufactured, where these can be the memory die 300 of FIG. 3A or the memory die 301 of FIG. 3B. These die are fabricated according to a specified design and set of values for the processing parameters used in the fabrication process. At step 2103, the memory die is tested to characterize the devices properties, where this is typically done for a representative subset of devices. From the device characterization testing, the behavior of the memory die when programming operations in MLC and SLC configurations can determined and used to determine Vpass ramp rates for the two configurations at step 2105 and the Vpass ramp interval timing for the two configurations at step 2107. Steps 2105 and 2107 can be performed in either order or concurrently. Additionally, in some embodiments, only one of these two sets of parameters may be settable so that one of these two steps would correspondingly be omitted.

Once the Vpass ramp rate and ramp interval timing values are determined for SLC and MLC operation in steps 2105 and 2107, the parameter values can be set in the registers for the memory dies, such as in the registers of the storage 366 of the system control logic 360, at step 2109. These values can be used for examples of the device made at the same time as the examples used for steps 2103, 2105, and 2107, or fabricated subsequently according to the same fabrication processing and parameters. In the embodiments of Tables 2 and 3 above, the RRC_VPASS_MLC, RRC_VPASS_SLC, ΔT_mlc, and ΔT_slc parameter values are three bit value, but other embodiments can use other numbers of bits. Tables 2 and 3 also show a particular set of scale factor values, but other embodiments can determine or use other sets of scale factors. The setting of the parameter values in the devices' registers can be performed during the die sort process when other operating parameters of the devices are set. In some embodiments, the parameter values for individual devices can be individually trimmed.

Once the memory dies have been had their operation parameters set and other pre-shipping preparation of the individual die are done, the dies may be assembled into packages, such as illustrated with respect to FIGS. 5A and 5B, at step 2011. In such a package, there may be memory die from different fabrication runs. The multi-die memory package can then be put into operation by an end user, with each of the die using its corresponding set of ramp rate scale factor values and ramp rate interval factor values, at step 2013. Depending on the embodiments, a single die may only operate as an SLC device using the SLC operating parameters; only operate as an MLC device using the MLC operating parameters; have arrays that be configured to operate in either mode using the corresponding operation parameters; or have portions, such as one or more planes, that operate in MLC mode and other portions, such as one or more planes, that operate in SLC mode using the corresponding operating parameters. A multi-die package may include various combinations of these different die configurations; for example, a multi-die package be include multiple die of the same type, but with some configured to operate in the SLC mode (such as in a "binary cache" arrangement) using SLC operating parameters and the other dies configured to operate in MLC mode using MLC operations parameters.

Figure 22:
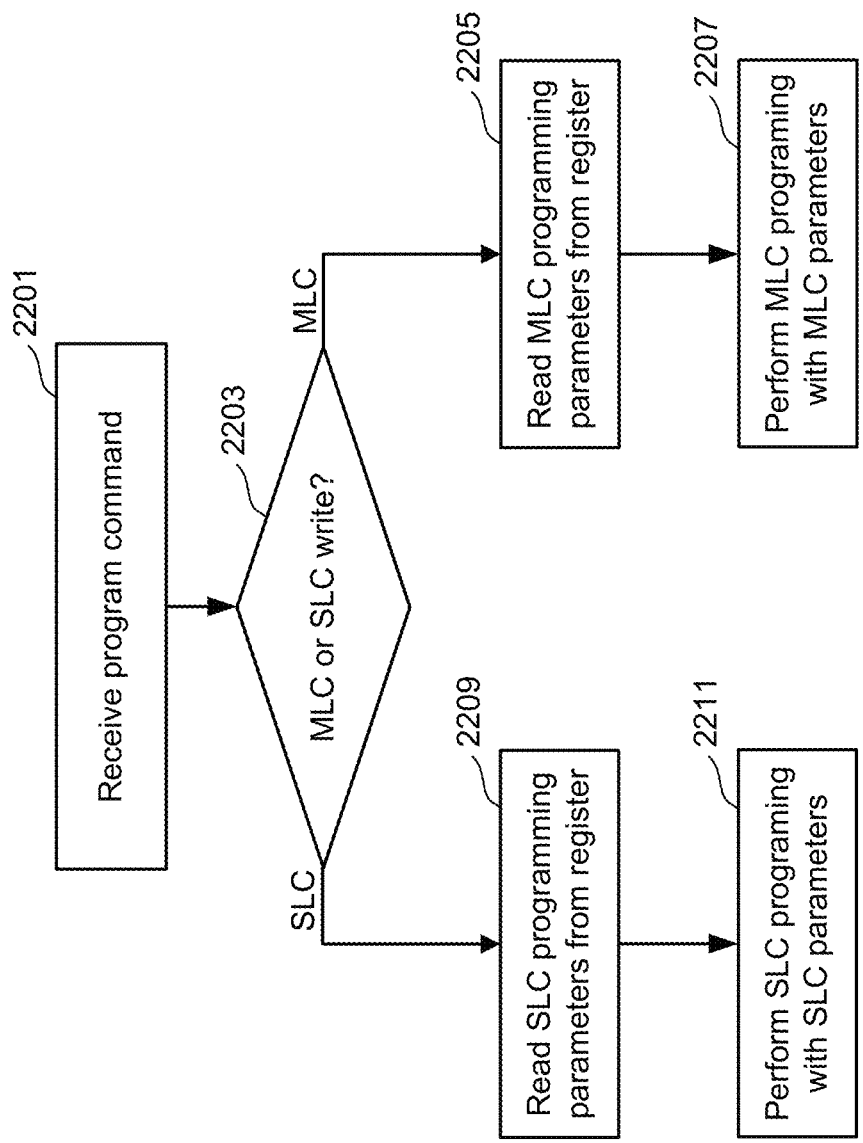
FIG. 22 is a flowchart for an embodiment to incorporate the use of the differential pass voltage ramp rates and ramp rate interval values for MLC and SLC operation.

FIG. 22 is a flowchart for an embodiment to incorporate the use of the differential Vpass ramp rates and ramp rate interval values for MLC and SLC operation. The elements of FIG. 22 are additional that can be incorporated into a write operation to incorporate individually settable SLC and MLC Vpass ramp rates and Vpass ramp rate interval values. Beginning at step 2201, a program command is received. The write command can be a host data write command from host 120 or generated on the memory controller 102, such as for housekeeping operations (garbage collection, rewriting data cached in SLC into MLC format, and other controller generated writes). Once the program command is received or generated on the memory controller, it is then received at the system control logic 360 at step 2203, where it is determined whether it is an MLC write or an SLC write. For an MLC write, at step 2205 the system control logic 360 reads the MLC programming parameters from the registers of storage 366, where, depending on the embodiment, this can be one or both of the MLC Vpass ramp rate parameter value and Vpass ramp rate interval parameter value, as well as other programming parameters. Multistate programming using these parameters then follows at step 2207 as described above with respect to FIGS. 8, 9, and 11-13. If, instead, the program command is for an SLC write, at step 2209 the system control logic 360 reads the SLC programming parameters from the registers of storage 366, where, depending on the embodiment, this can be one or both of the SLC Vpass ramp rate parameter value and Vpass ramp rate interval parameter value, as well as other programming parameters. Binary programming using these parameters then follows at step 2211 as described above with respect to FIGS. 8, 9, 10, and 13.

Returning to FIG. 13, to this point the discussion has been focused on possible current spike that can arise from the change in bias levels for the unselected word lines, VWL_unsel. Current spikes can also arise from the biasing of selected word lines, VWLn, during sensing operations, such in the program verification transitions indicated at 1305, 1306, 1307, and 1308. The following techniques reduce current spikes during the biasing of selected word lines during such sensing operations, particularly in situations where a selected word lines is sensed consecutively at multiple levels, as at VvA 1307 and VvB 1308 of FIG. 13.

As discussed above with respect to FIGS. 8-12, a program operation uses a sequence of programming pulses of increasing amplitude with a verify operation between the pulses. In a standard binary, or SLC, write operation, there is a single inter-pulse verify as illustrated in FIG. 9, while in multi-state, or MLC, write operations there are multiple inter-pulse verify operations as illustrated in FIG. 10. As described with respect to FIGS. 10-12, one verify is performed for each data state above the erased state. In some embodiments, more than one verify may be done for the individual states, such as in "quick pass write" operations that use a high and a low verify level to determine when a memory cell is approaching its target state and partially inhibit faster memory cells to slow their programming rate.

FIG. 23 illustrates the idea of multiple verify levels for a single state, such as for use in a quick pass write embodiment. After a program pulse, the memory cells of the distribution 2302 are verified at both a high level VH and a low level VL for the target data state. Memory cells in the region 2308 will have $V_T$ values above VH and verify as programmed to the target state and be inhibited from programming at the next programming pulse by setting the corresponding bit line to the program inhibit voltage level. Memory cells in both of regions 2306 and 2304 will not verify at VH and will need further programming. However, for memory cells in the region 2306 that have a $V_T$ below, but near, VH, a full programming pulse could lead to memory cells of the region 2306 to be over programmed, whereas the memory cells in the region 2304 should be able to receive a full programming pulse. To distinguish between these two regions, the low verify level VL is used, so that memory cells below VL can have their corresponding bit lines left at the program enable voltage for the next pulse. For memory cells in the region 2306 that verify at VL, but not VH, the memory cells can be partially inhibited by having their corresponding bit line set to a voltage level between the program inhibit and the program enable levels, partially shielding the memory cell from the full level of the subsequent programming pulse and helping avoid over programming. This allows for a larger step size ΔVpgm to be used for the programming waveform of FIG. 9, while still providing good margins between the distributions of the different data states, thereby increasing write performance. However, the increase in the number of verify operations has a negative effect on write performance. To address this negative effect, a smart verify scheme can be used.

In a smart verify algorithm, only a subset of the verify levels are checked in a verify operation since, at a given loop of the programming operation, the memory cells still being programmed will lie within a limited range of these values. For example, at the first few pulse only the data state S1 would be checked, with S2 being added after a few pulses, followed by data S3 somewhat later. The lower data states can be progressively dropped out, so that a moving window of data states is verified between pulses. If quick pass write is being used, the low and high verify levels of each data state can similarly be progressively added and dropped as programming progresses. For example, initially (or after one or more non-verify loops) only VL for data state S1 is checked, with VH for S1, VL for S2, and so on being progressively added, and with VL for S1, VH for S2, and so on begin progressively dropped. FIG. 23 illustrates the incorporation of a smart verify into the flow chart of FIG. 8.

FIG. 24 illustrates a modification of FIG. 8 for an embodiment to incorporate smart verify into the programming algorithm. More specifically, FIG. 23 shows a portion of FIG. 8 that includes steps 872 and 874, but with an additional step 873 inserted. Step 873 determines which verify levels to include in the verify of 874 of the current loop. Different embodiments can be used for the determination of which verify level or levels to include in a given programming loop. In some embodiments, the determination can be made based on the loop count. For example, during device characterization a determination can be made of which verify levels to include a give loop, where the values could be set as parameter values as part of the operating parameters stored in the registers of storage 366 of the system control logic 360. In other embodiments, the determination could be dynamic, where as memory cells (or some number of memory cells) begin to verify at one level, the next level is added in, and as there are no longer many cells verifying at the lowest current level, this level can be dropped. In any case, at different stages in the programming cycle there may be different numbers of verify levels being performed between pulses, such as only a single verify in earlier loops, the verify levels increasing in number as programming progresses, and eventually dropping back down to only a single verify.

Referring now back to FIG. 13 and the selected word line waveform, VWLn, an Icc peak can arise when VWLn is ramping up starting at t11 for the sensing operation(s) of program verify. This peak becomes stronger during smart verify as more states are included in the verify phase. FIG. 13 illustrates two verify levels, VvA at 1307 and VvB at 1308, where, for example, these could respectively be for data state S1 and data state S2 or, in an embodiment using quick pass write, these could be VL for data state S1 and VH for data state S1. At an earlier programming loop, only a single verify level VvA at 1307 may be present, with higher verify levels being added at later loops and lower levels such as VvA dropping at out. The Icc peak when ramping up the selected word line WLn for the verify phase during smart verify becomes stronger when ramping for verifying two levels rather just a single level. The following discussion will focus on the case when switching from programming loops with a single verify level, such as VL for data state S1, to programming loops with two verify levels, such as VL and VH for data state S1, but can more generally be applied at other stages of a smart verify programming algorithm when the number of levels being verified at one loop changes to a different number at a subsequent loop.

Still referring to FIG. 13, at t9 both VWLn and VWL_unsel ramp up to Vread to turn on all of the memory cell transistors in the NAND string to establish the bias conditions for sensing the selected memory cell along WLn. At t10 VWLn then ramps down to 0V to turn off the selected transistor, after which the verify sensing can begin at t11. When multiple verify levels follow starting at t11, a larger Icc spike is found than when only a single verify level follows. This could be caused by an insufficient discharge time for the control gate of the selected memory cell transistor between t10 and t11 when sensing for multiple verify levels following at t11 and thereafter. To address this issue, embodiments presented here use a word line ramp start time for program verify that is program loop dependent for selected word lines for the verify sensing operation, introducing a delay that depends on the number of verify levels. In the example embodiment, one ramp rate start time is used when a single verify level is used and a second ramp rate is used when a second verify level is added. More generally, different delays can be used for differing number of verifies in the program loop. This is illustrated with respect to FIGS. 25 and 26.

Figure 25:
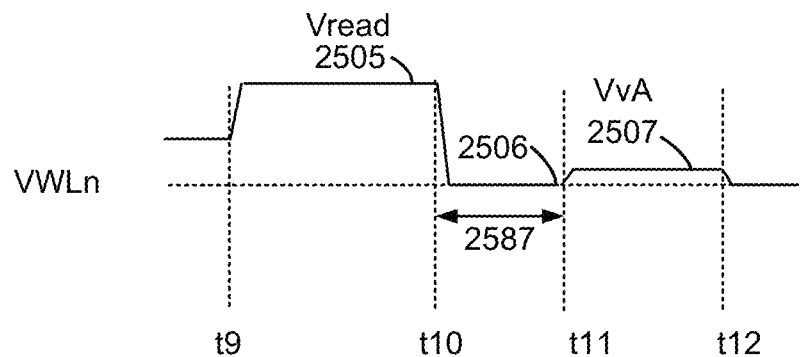
FIGS. 25 and 26 illustrate the use of differing times for a program verify operation depending on the programming loop.
Figure 26:
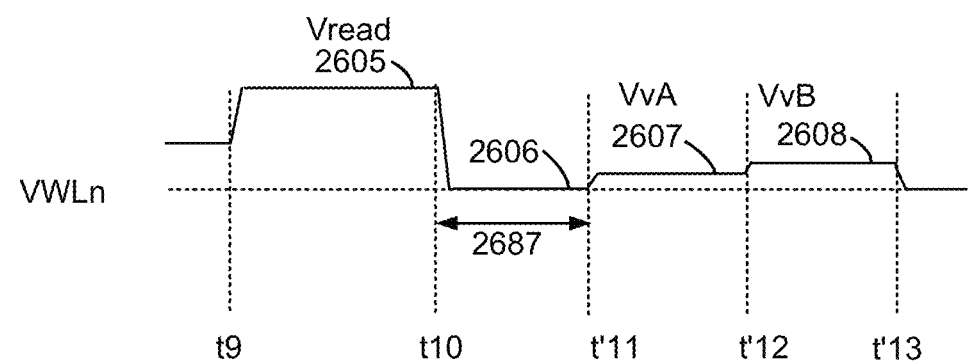

FIGS. 25 and 26 illustrate the use of differing timings for a program verify operation depending on the programming loop. More specifically, FIG. 25 shows the selected word line programming waveform following a programming pulse through the verify phase when a single verify level is being used, as in an early programming loop, and FIG. 26 shows the selected word line programming waveform following a programming pulse through the verify phase after a second verify level is introduced.

FIG. 25 takes up VWLn in a programming loop with a single verify level VvA after the programming pulse is applied. At t9 VWLn is ramped up to Vread 2505 at the same time at the unselected word lines of the NAND array are ramped up to Vread to bias all of the memory cells of the NAND string to be in an on state for a sensing operation. At t10 the un-selected word lines are left biased at Vread, while VWLn is taken back to ground (or more general low voltage) at 2506. During the interval t10-t11 2587, the control gate of the selected memory cell discharges. After the delay 2587, the selected word line WLn is the ramped up to the verify level VvA 2507 at t11 for the sensing operation, before being ramped down at t12. After t12, based on the result of verify operation, the selected memory cell may be program inhibited, partially inhibited (if in an embodiment with quick pass write), or left program enabled and the programming flow continues on to the next program loop.

FIG. 26 looks at the same portion of a program loop as FIG. 25, but with two verify levels. For example, this could be the loop immediately following the programming algorithm loop corresponding to FIG. 25, but where a second verify level has now been added, such as based on loop count or the results of VvA verifies in the preceding loop. In the embodiment of FIG. 26, VWLn is the same as in FIG. 25 through t10. FIG. 26 differs from FIG. 25 in that the delay 2687 from t10 to t'11 after dropping VWLn from Vread 2605 to ground at 2606 is increased, providing additional time for the control gate on the selected memory cells to discharge before VWLn is ramped up to VvA 2607 at t'11 and then on to VvB 2608 at t'12 in order to help reduce Icc spikes. After t'13, based on the result of verify operation, the selected memory cell may be program inhibited, partially inhibited (if in an embodiment with quick pass write), or left program enabled and the programming flow continues on to the next program loop.

Figure 27:
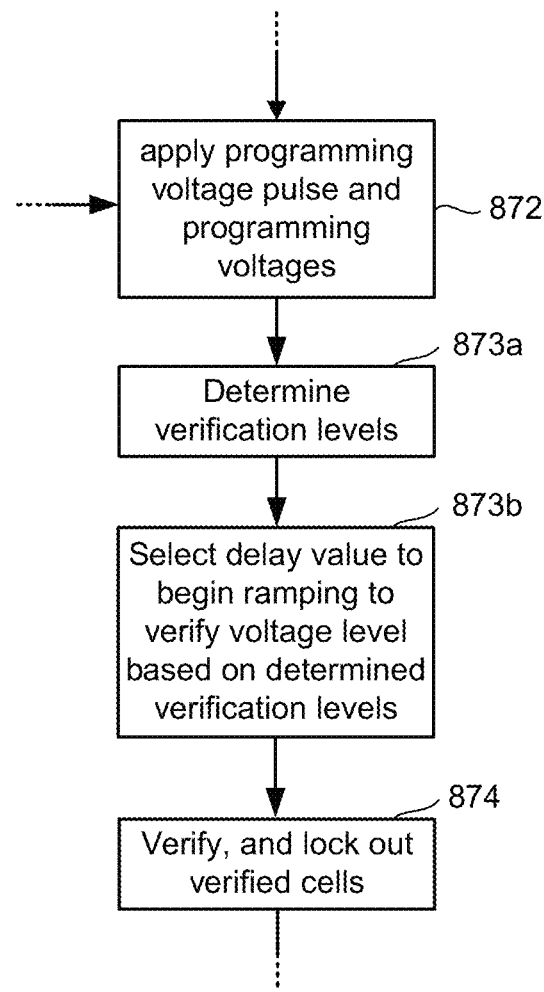
FIG. 27 is a flowchart of an embodiment for loop dependent word line ramp start time for program verify of multi-level NAND memory.

FIG. 27 is a flowchart of an embodiment for loop dependent word line ramp start time for program verify of multi-level NAND memory. FIG. 27 is an extension of FIG. 24 and a further extension of FIG. 8 to incorporate the selection of the amount of delay before ramping up the selected word line to the voltage levels for the sensing or sensings of the program verify phase. More specifically, in addition to adding a step 873a (873 of FIG. 24) into the flow of FIG. 8, a step 873b is now added. Steps 873a and 874 can be as described with respect to steps 873 and 874, respectively, of FIG. 24. As discussed above, depending on the embodiment, the determination at step 873a of which verify levels to include in the verify phase can be based on: loop count and parameter values stored in the registers of the storage 366 of the system control logic; the number of memory cells verifying at the verify levels used in the preceding loop as determined by the system control logic; or combinations of the these and/or other factors, such as using the loop count, but it allowing it to be shifted based on verify or ECC results, for example.

In step 873b, the delay value to begin ramping up to the first of the verify level or levels is selected based on the number of verification levels, and which of the verification levels for some embodiments, selected at step 873a. For example, in FIG. 25 the delay t10-t11 2587 is selected based on the single verify VvA while in FIG. 26 the delay t10-t'11 2687 based on the two verifies VvA and VvB. In some embodiments, the delay values can be set as parameters in storage 366 of system control logic 360 that are then selected by the control logic 360 based upon the verification levels determined in step 873a. In the example embodiment, two delay values are illustrated, but, more generally, more than two delay values can be available for selection based upon the different number of verification levels and, in some embodiments, the different one of the first of the verify levels as a given loop of the program algorithm using smart verify. One the verify levels and delay is selected at steps 873a and 873b, the flow can continue on to step 874 as described previously.

One embodiment includes a non-volatile memory device comprising a control circuit configured to connect to an array of non-volatile memory cells having a NAND architecture and configured to store data in a multi-level cell (MLC) format for the memory cells. The control circuit is configured to program a selected memory cells of a NAND string connected along a selected word line by applying a series of a plurality of program pulses to the selected word line alternating with a corresponding one or more of a plurality of verify operations for the selected memory cell. To perform each of the verify operations the control circuit is configured to: bias the selected word line and unselected word lines connected to the NAND string to an unselected word line read voltage level; subsequent to biasing the selected word line the unselected word line read voltage level, bias the selected word line to a low voltage level; determine one or more of a plurality of verify voltage levels; based on a number of the determined verify voltage levels, select a corresponding one of a plurality of delay times; and subsequent to biasing the selected word line to the low voltage level, sequentially bias the selected word line to the plurality of determined verify voltage levels after waiting the corresponding selected delay time.

One embodiment includes a method comprising writing each of a plurality of non-volatile memory cells connected along a selected word line to a corresponding one of a plurality of target data states, each of the non-volatile memory cells belonging to a corresponding NAND string to which the selected word line connected, by performing a plurality of programming loops. Each of the programming loops comprises: applying a programming pulse to the selected word line; selecting one or more of a plurality of verify voltage levels; based on a number of the one or more of the verify voltage levels selected, selecting a corresponding one of a plurality of delay times; and subsequent to applying the programming pulse to the selected word line and selecting the corresponding one of the plurality of delay times, sequentially biasing the selected word line to the selected one or more verify voltage levels after waiting the corresponding selected delay time.

One embodiment includes a non-volatile memory device comprising an array of non-volatile memory cells and one or more control circuits connected to the array. The array of non-volatile memory cells comprises: a plurality of word lines; and a plurality of NAND strings each having a plurality of memory cells each with a control gate connected to a corresponding one of the word lines. The one or more control circuits are configured to write each of a plurality of non-volatile memory cells connected along a selected word line to a corresponding one of a plurality of target data states by performing a plurality of programming loops in each of which the one or more control circuits are configured to: apply a programming pulse to the selected word line; select one or more of a plurality of verify voltage levels; based on a number of the one or more of the verify voltage levels selected, select a corresponding one of a plurality of delay times; and subsequent to applying the programming pulse to the selected word line and selecting the corresponding one of the plurality of delay times, sequentially bias the selected word line to the selected one or more verify voltage levels after waiting the corresponding selected delay time.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
   a control circuit configured to connect to an array of non-volatile memory cells having a NAND architecture and configured to store data in a multi-level cell (MLC) format for the memory cells, the control circuit configured to:
   program a selected memory cell of a NAND string connected along a selected word line by applying a series of a plurality of program pulses to the selected word line alternating with a corresponding one or more of a plurality of verify operations for the selected memory cell, where to perform each of the verify operations the control circuit is configured to:
   bias the selected word line and unselected word lines connected to the NAND string to an unselected word line read voltage level;
   subsequent to biasing the selected word line the unselected word line read voltage level, bias the selected word line to a low voltage level;
   determine one or more of a plurality of verify voltage levels;
   based on a number of the determined one or more of the verify voltage levels, select a corresponding one of a plurality of delay times; and
   subsequent to biasing the selected word line to the low voltage level, sequentially bias the selected word line to the plurality of determined verify voltage levels after waiting the corresponding selected delay time.

2. The non-volatile memory device of claim 1, wherein the control circuit is on a control die, the non-volatile memory device further comprising:
   a memory die including the array of non-volatile memory cells, the memory die formed separately from and bonded to the control die.

3. The non-volatile memory device of claim 1, wherein the plurality of delay times includes a first delay time and a second delay time, the second delay time being greater than the first delay time and the second delay time corresponds to a greater number of determined verify voltage levels than the first delay time.

4. The non-volatile memory device of claim 3, wherein the first delay time corresponds to a single determined verify voltage level and the second delay time corresponds to two determined verify voltage levels.

5. The non-volatile memory device of claim 1, wherein the plurality of verify voltage levels includes levels corresponding to a plurality of target data states.

6. The non-volatile memory device of claim 5, wherein to perform each of the verify operations the control circuit is further configured to:
   in response to a selected memory cell verifying at the selected memory cell's target data state, bias the selected memory cell to inhibit further programming.

7. The non-volatile memory device of claim 1, wherein the plurality of verify voltage levels include levels corresponding to a low verify level of a first target data state and a high verify level of the first target data state.

8. The non-volatile memory device of claim 7, wherein to perform each of the verify operations the control circuit is further configured to:
   in response to a selected memory cell having the first target data state verifying at the low verify level of the first target data state, bias the selected memory cell to partially inhibit further programming; and in response to the selected memory cell having the first target data state verifying at the high verify level of the first target data state, bias the selected memory cell to inhibit further programming.

9. The non-volatile memory device of claim 1, further comprising:
the array of non-volatile memory cells having a NAND architecture, the array having a three dimensional architecture in which NAND string run vertically relative to a horizontal substrate.

10. The non-volatile memory of claim 1, wherein the control circuit comprises:
registers configured to store operating parameters for the memory array, the operating parameters including parameter values corresponding to the plurality of delay times, selecting the corresponding one of a plurality of delay times comprises selecting the corresponding parameter value.

11. A method, comprising:
writing each of a plurality of non-volatile memory cells connected along a selected word line to a corresponding one of a plurality of target data states, each of the non-volatile memory cells belonging to a corresponding NAND string to which the selected word line is connected, by performing a plurality of programming loops each comprising:
applying a programming pulse to the selected word line;
selecting one or more of a plurality of verify voltage levels;
based on a number of the one or more of the verify voltage levels selected, selecting a corresponding one of a plurality of delay times; and
subsequent to applying the programming pulse to the selected word line and selecting the corresponding one of the plurality of delay times, sequentially biasing the selected word line to the selected one or more verify voltage levels after waiting the corresponding selected delay time.

12. The method of claim 11, wherein the plurality of verify voltage levels include levels corresponding to a low verify level of a first target data state and a high verify level of the first target data state, and wherein performing each of the plurality of programming loops further comprises:
in response to a selected memory cell having the first target data state verifying at the low verify level of the first target data state, biasing the selected memory cell to partially inhibit further programming; and
in response to the selected memory cell having the first target data state verifying at the high verify level of the first target data state, biasing the selected memory cell to inhibit further programming.

13. The method of claim 11, wherein the plurality of verify voltage levels includes levels corresponding to a plurality of target data states, and wherein performing each of the plurality of programming loops further comprises:
in response to a selected memory cell verifying at the selected memory cell's corresponding target data state, biasing the selected memory cell to inhibit further programming.

14. The method of claim 11, wherein performing each of the plurality of programming loops further comprises:
subsequent to applying the programming pulse to the selected word line and prior to sequentially biasing the selected word line to the selected one or verify voltage levels, biasing the selected word line and unselected word lines of the connected to the NAND strings to an unselected word line read voltage level; and
subsequent to biasing the selected word line the unselected word line read voltage level, biasing the selected word line to a low voltage level prior to waiting the corresponding selected delay time.

15. The method of claim 11, wherein the NAND strings are part of a memory array on a memory die and the performing each of the plurality of programming loops further comprises:
applying the programming pulse to the selected word line by a control circuit formed on a control die formed separately from and bonded to the memory die; and
biasing the selected word line to the selected one or more verify voltage levels by the control circuit.

16. A non-volatile memory device, comprising:
an array of non-volatile memory cells configured to store data in a multi-level cell format, comprising:
a plurality of word lines; and
a plurality of NAND strings each having a plurality of memory cells each with a control gate connected to a corresponding one of the word lines; and
one or more control circuits connected to the array and configured to write each of a plurality of non-volatile memory cells connected along a selected word line to a corresponding one of a plurality of target data states by performing a plurality of programming loops in each of which the one or more control circuits are configured to:
apply a programming pulse to the selected word line;
select one or more of a plurality of verify voltage levels;
based on a number of the one or more of the verify voltage levels selected, select a corresponding one of a plurality of delay times; and
subsequent to applying the programming pulse to the selected word line and selecting the corresponding one of the plurality of delay times, sequentially bias the selected word line to the selected one or more verify voltage levels after waiting the corresponding selected delay time.

17. The non-volatile memory device of claim 16, wherein the plurality of verify voltage levels include levels corresponding to a low verify level of a first target data state and a high verify level of the first target data state, and wherein to perform each of the plurality of programming loops the one or more control circuits are further configured to:
in response to a selected memory cell having the first target data state verifying at the low verify level of the first target data state, bias the selected memory cell to partially inhibit further programming; and
in response to the selected memory cell having the first target data state verifying at the high verify level of the first target data state, bias the selected memory cell to inhibit further programming.

18. The non-volatile memory device of claim 16, wherein the plurality of verify voltage levels includes levels corresponding to a plurality of target data states, and wherein to perform each of the plurality of programming loops the one or more control circuits are further configured to:
in response to a selected memory cell verifying at the selected memory cell's corresponding target data state, biasing the selected memory cell to inhibit further programming.

19. The non-volatile memory device of claim 16, wherein to perform each of the plurality of programming loops the one or more control circuits are further configured to:

subsequent to applying the programming pulse to the selected word line and prior to sequentially biasing the selected word line to the selected one or more verify voltage levels, bias the selected word line and unselected word lines of the connected to the NAND strings to an unselected word line read voltage level; and subsequent to biasing the selected word line the unselected word line read voltage level, bias the selected word line to a low voltage level prior to waiting the corresponding selected delay time.

20. The non-volatile memory device of claim 16, wherein the NAND strings are part of a memory die and the one or more control circuits are on a memory die formed separately from and bonded to the memory die.

* * * * *